United States Patent [19]
Minakuchi et al.

[11] Patent Number: 6,114,682
[45] Date of Patent: Sep. 5, 2000

[54] APPARATUS AND METHOD FOR CONTROLLING LIGHT INTENSITY

[75] Inventors: Tadashi Minakuchi; Makoto Nukui; Mitsunori Iima, all of Saitama, Japan

[73] Assignee: Asahi Kogaku Kogyo Kabushiki Kaisha, Tokyo, Japan

[21] Appl. No.: 09/139,573

[22] Filed: Aug. 25, 1998

[30] Foreign Application Priority Data

Aug. 27, 1997 [JP] Japan .................................. 9-231418
Aug. 27, 1997 [JP] Japan .................................. 9-231419

[51] Int. Cl.[7] .............................. G02B 26/10; H01S 3/10
[52] U.S. Cl. ......................... 250/205; 250/225; 250/235; 250/236; 347/133
[58] Field of Search ..................................... 250/205, 225, 250/234, 235, 236; 372/26, 27, 29, 31, 38; 347/132, 133, 134, 135

[56] References Cited

U.S. PATENT DOCUMENTS 5,233,188  8/1993  Arimoto et al. ......................... 250/235
5,892,219  4/1999  Minakuchi et al. ..................... 250/205

*Primary Examiner*—John R. Lee
*Attorney, Agent, or Firm*—Greenblum & Bernstein, P.L.C.

[57] ABSTRACT

A light intensity control apparatus includes an optical beam splitter which splits light into monitor light and principal light; a polarization beam splitter which splits the monitor light into two polarized light components; a monitor light detector which detects the polarized light components; a polarization correction device which corrects the output of the monitor light detector so that the intensity of the output signal of the monitor light detector and the light intensity of the principal light on an object surface have a predetermined correlation, regardless of the polarization state of the light incident upon the optical beam splitter; and a humidity dependency correction device which corrects the output of the monitor light detector via the polarization correction device by detecting a variation in polarization dependency characteristics of the optical beam splitter, caused by a change in humidity, and feeding the variation back to the polarization correction device, so that the output signal intensity of the monitor light detector and the light intensity of the principal light on the object surface have a predetermined correlation, regardless of a change in the humidity. The invention is also directed to a light intensity control method.

9 Claims, 25 Drawing Sheets

APPARATUS AND METHOD FOR CONTROLLING LIGHT INTENSITY

BACKGROUND OF THE INVENTION

1. Field of the Invention

The present invention relates to light intensity control apparatus and method, in which light emitted from a light source is split into monitor light and principal light so that the quantity of light to be emitted from the light source can be controlled in accordance with the intensity of the monitoring light.

The present disclosure relates to subject matter contained in U.S. patent application Ser. No. 08/654,824 filed on May 29, 1996 entitled "Light Intensity Controlling Device", now U.S. Pat. No. 5,892,219, the disclosure of which is expressly incorporated by reference herein.

2. Description of the Related Art

In an optical scanner or the like, the light emitted from the light source is split into monitor light and principal light and the intensity of the monitor light is detected, so that the quantity of the light to be emitted from the light source can be controlled in accordance with the intensity of the monitor light to thereby control the intensity of the principal light. For example, in an optical disc apparatus, laser beams emitted from a light source such as a semiconductor laser is split by a beam splitter such as a half mirror into monitor light which is used to detect the light intensity and principal light which is made incident upon an optical disc located on an image forming surface to read data therefrom or write data thereon.

In the intensity control apparatus, a so-called APC (Automatic Power Control) operation is carried out in which the light intensity of the light source is controlled in accordance with the light intensity of the monitor light to obtain a desired light intensity on the optical disc. To this end, the intensity of the output signal of the optical detector which detects the monitor light must have a predetermined correlation with the light intensity of the principal light. However, since the reflection-transmission characteristics of the beam splitter or other optical elements located behind the beam splitter vary depending on the polarization (polarization dependency), if the polarization state of the light incident upon the beam splitter changes, the balance between the output signal intensity of the monitor light and the light intensity of the principal light is broken, thus resulting in the APC operation not being carried out effectively.

For instance, in an optical apparatus in which a plurality of light sources are employed, the polarization state of the plural light bundles tends to be irregular. Moreover, in case of the light emitted from a single light source, the polarization state of the light varies due to environmental conditions or the arrangement of the optical elements before the light reaches the beam splitter. If a change in the polarization state of the incident light occurs, it is impossible to correct the output signal since the optical elements including the beam splitter have dependency on the polarization. Consequently, even if the APC operation is carried out to control the quantity of light to be emitted from the light source, it is impossible to keep the light intensity of the principal light on an object surface at a predetermined level. In the worst case, an intensity error of the light on the object surface could be enhanced by the APC operation.

In addition, the polarization dependency characteristics (polarized light component ratio of the reflection light or transmission light) of the beam splitter vary depending upon the humidity. For instance, since the surface of the half mirror coated with a dielectric layer is exposed to the outside, the polarized light component ratio of the monitor light transmitted through the half mirror tends to change due to a change in the humidity of the ambient air. Therefore, it is desirable that the light intensity control be carried out, taking into account influence of a change in humidity.

SUMMARY OF THE INVENTION

It is an object of the present invention to provide light intensity control apparatus and method in which light is split by a beam splitter into principal light and monitor light which is used to control the light intensity of the principal light on an object surface, so that the quantity of the principal light can be precisely controlled, regardless of the polarization dependency characteristics of the beam splitter which vary in turn depending on the humidity.

To achieve the object mentioned above, according to the present invention, there is provided a light intensity control apparatus comprising an optical beam splitter which splits light emitted from a light source device having at least one light source into monitor light and principal light; a polarization beam splitter which splits the monitor light into first and second linearly polarized light components having orthogonal oscillation directions; a monitor light detector for separately detecting the light intensities of the first and second linearly polarized light components of the monitor light; an object surface on which the principal light being scanned; a polarization correction device for correcting the output of the monitor light detector so that the intensity of the output signal of the monitor light detector and the light intensity of the principal light on the object surface have a predetermined correlation, regardless of the polarization state of the light incident upon the optical beam splitter; a humidity dependency correction device which corrects the output of the monitor light detector via the polarization correction device by detecting a variation in polarization dependency characteristics of the optical beam splitter, caused by a change in humidity, and feeding the variation back to the polarization correction device, so that the output signal intensity of the monitor light detector and the light intensity of the principal light on the object surface have a predetermined correlation, regardless of a change in humidity; and a light emission controller for controlling the emission of the light of the light source device in accordance with the output signal of the monitor light detector which have been corrected by the polarization correction device and the humidity dependency correction device.

The humidity dependency correction device can be comprised of a humidity detector for measuring the humidity in the vicinity of the optical beam splitter; a polarization dependency variation detector for detecting the variation of the polarization dependency characteristics of the optical beam splitter based on the change in the output signal of the humidity detector; and a feedback device for feeding the detected variation of the polarization dependency characteristics of the optical beam splitter back to the polarization correction device.

Preferably, the polarization correction device amplifies the output signal intensity of at least one of the first and second linearly polarized light components at a predetermined weighing-value and recombines the outputs of the first and second linearly polarized light components for correcting the output of the monitor light detector; if the humidity changes with respect to the reference humidity, the feedback device outputs a control signal based on the variation in humidity detected by the humidity detector in accordance with the control signal, and the polarization correction device corrects the weighing-value so as not to change the output signal intensity of the monitor light detector from before the change in humidity.

According to another aspect of the present invention, there is provided a light intensity control method light emitted from at least one light source and is split into monitor light and principal light by an optical beam splitter; the monitor light is split into first and second linearly polarized light components having orthogonal oscillation directions by a polarization beam splitter; the light intensities of the first and second linearly polarized light components of the monitor light are separately detected by a monitor light detector; the output signal of the monitor light detector is corrected by a polarization correction device so that the output signal intensity of the monitor light detector and the light intensity of the principal light on an object surface have a predetermined correlation, regardless of the polarization state of the light incident upon the optical beam splitter; the emission of the light source is controlled based on the corrected output signal; wherein the control method comprises in a setting stage: setting the humidity when the optical beam splitter whose polarization dependency varies depending on the humidity has a predetermined polarization dependency at a reference humidity; storing a variation rate of polarization dependency of the optical beam splitter when the humidity changes with respect to the reference humidity in a polarization dependency variation detector; and wherein the control method comprises in a use stage: measuring the humidity in the vicinity of the optical beam splitter by means of a humidity detector; determining the variation of the polarization dependency characteristics of the optical beam splitter by means of the polarization dependency variation detector, in accordance with the difference between the measured humidity and the reference humidity; feeding back the variation of the polarization dependency characteristics to the polarization correction device; and correcting the output of the monitor light detector in accordance with the input variation of the polarization dependency characteristics of the optical beam splitter so that the output signal intensity of the monitor light detector and the light intensity of the principal light on the object surface have a predetermined correlation, regardless of a change in humidity.

According to still another aspect of the present invention, a light intensity control apparatus comprises an optical beam splitter which splits light emitted from a light source device having at least one light source into monitor light and principal light; a polarization beam splitter which splits the monitor light into first and second linearly polarized light components having orthogonal oscillation directions; a monitor light detector for separately detecting the light intensities of the first and second linearly polarized light components of the monitor light split by the polarization beam splitter; an object surface on which the principal light being scanned; a polarization correction device for correcting the output of the monitor light detector so that the intensity of the output signal of the monitor light detector and the light intensity of the principal light on the object surface have a predetermined correlation, regardless of the polarization state of the light incident upon the optical beam splitter; a light emission controller for controlling the emission of the light of the light source device in accordance with the output signal of the monitor light detector which have been corrected by the polarization correction device; a reference light supply device separate from the light source device, for making a reference light having constant polarization characteristics incident upon the optical beam splitter in the same direction and at the same incident angle as the light emitted from the light source device; a reference light detector for detecting the light intensity of the reference light component of the reference light incident upon and split by the optical beam splitter that has the same direction as the monitor light; a polarization dependency variation detector for detecting the variation of the polarization dependency characteristics of the optical beam splitter, based on a change in the output signal of the reference light detector when the polarization dependency characteristics of the optical beam splitter change due to a change in humidity; and a feedback device for feeding the detected variation of the polarization dependency of the optical beam splitter back to the polarization correction device; wherein the polarization correction device corrects the output of the monitor light detector in accordance with the variation of the polarization dependency characteristics of the optical beam splitter input from the feedback device so that the output signal intensity of the monitor light detector and the light intensity of the principal light on the object surface have a predetermined correlation, regardless of a change in humidity.

Preferably, the polarization correction device amplifies the output signal intensity of at least one of the first and second linearly polarized light components at a predetermined weighing-value and recombines the outputs of the first and second linearly polarized light components for correcting the output of the monitor light detector. If a change in humidity occurs, the feedback device outputs a control signal based on the change in output of the reference light detector, in accordance with the control signal; and the polarization correction device corrects the weighing-value so as not to change the output signal intensity of the monitor light detector from before the change in humidity.

The monitor light detector and the reference light detector can be made of separate light receiving elements or a common light receiving element.

According to yet another aspect of the present invention, there is provided a light intensity control method in which light emitted from at least one light source is split into monitor light and principal light by an optical beam splitter; the monitor light is split into first and second linearly polarized light components having orthogonal oscillation directions by a polarization beam splitter; the light intensities of the first and second linearly polarized light components of the monitor light are separately detected by a monitor light detector; the output signal of the monitor light detector is corrected by a polarization correction device so that the output signal intensity of the monitor light detector and the light intensity of the principal light on an object surface have a predetermined correlation, regardless of the polarization state of the light incident upon the optical beam splitter; the emission of the light source is controlled based on the corrected output signal; wherein the control method comprises: making reference light having constant polarization characteristics incident upon the optical beam splitter at the same incident angle and in the same direction as those of the light emitted from the light source and incident upon the optical beam splitter; detecting the light intensity of the reference light component of the reference light incident upon and split by the optical beam splitter that has the same direction as the monitor light; determining the variation of the polarization dependency characteristics of the optical beam splitter that varies depending on a change in humidity in accordance with the detected change in the output of the reference light transmitted through the optical beam splitter; feeding back the variation of the polarization dependency characteristics to the polarization correction device; and correcting the output of the monitor light detector in accordance with the input variation of the polarization dependency characteristics of the optical beam splitter so that the output signal intensity of the monitor light detector and the light intensity of the principal light on the object surface have a predetermined correlation, regardless of the change in the humidity.

The present disclosure relates to subject matter contained in Japanese Patent Application Nos. 09-231418 (filed on Aug. 27, 1997) and 09-231419 (filed on Aug. 27, 1997) which are expressly incorporated herein by reference in their entirety.

BRIEF DESCRIPTION OF THE DRAWINGS

The invention will be described below in detail with reference to the accompanying drawings, in which.

DESCRIPTION OF THE PREFERRED EMBODIMENT

Figure 1:
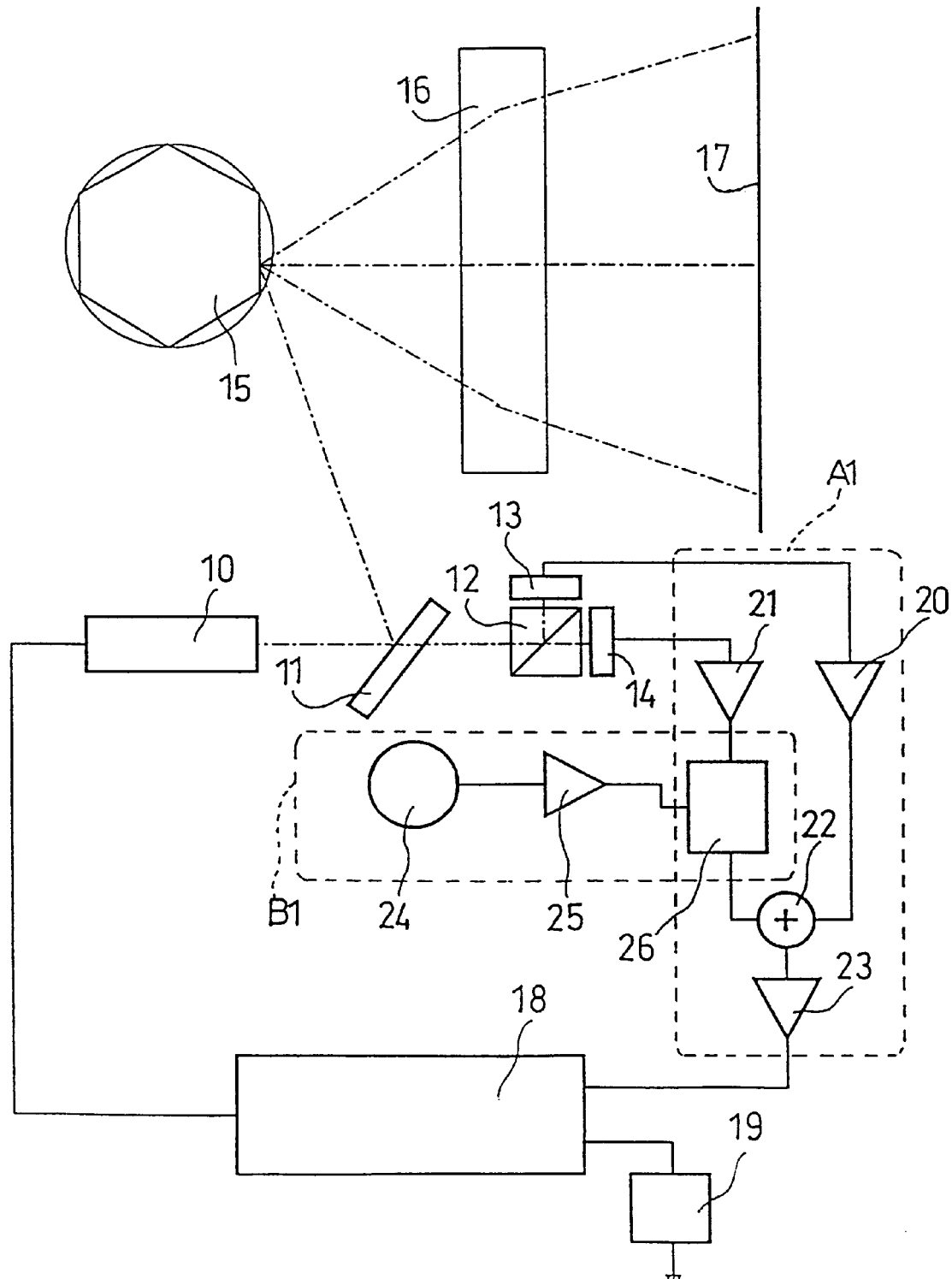
FIG. 1 is a schematic view of a light intensity control apparatus according to the present invention.

A light intensity control apparatus according to the present invention will be described below with reference to FIG. 1. An optical beam scanner having a light intensity control apparatus incorporated therein is comprised of a multiple beam light source 10 having a plurality of semiconductor laser oscillators and a plurality of optical fibers corresponding thereto. The optical fibers are aligned and secured at the emission ends thereof. The beams emitted from the optical fibers are made incident substantially in parallel upon a half mirror 11 which constitutes an optical beam splitter, so that the beams partly pass through the half mirror 11 and are partly reflected by a reflection surface coated on the half mirror 11.

The light transmitted through the half mirror 11 is made incident upon a cubic polarization beam splitter 12 as monitoring light. The polarization beam splitter 12 splits each monitoring beam into polarized light components (S-polarized light and P-polarized light) whose oscillation directions of the electric field vector are orthogonal to each other, so that the split light components are received by optical detectors 13 and 14 which detect the quantity of light. In the illustrated embodiment, the monitor light is split into P-polarized light and S-polarized light which are detected by the optical detectors 13 and 14, respectively. The principal light reflected by the half mirror 11 is reflected by a reflection surface of a rotatable scanning polygonal mirror 15 and is converged onto an object surface (image surface) 17 to be scanned through an fθ lens 16 provided between the polygonal mirror 15 and the object surface 17.

Note that in the present invention, the first beam splitter which splits the beam into the principal light and the monitoring light is referred to as the "optical beam splitter" or simply the "beam splitter" and the second beam splitter which splits each monitoring light into polarized light components is referred as the "polarization beam splitter".

The light source power control circuit 18 controls the power of the semiconductor laser oscillators (including an ON/OFF control), so that when the image surface 17 is scanned with the principal light within a predetermined scanning range in accordance with the rotation of the polygonal mirror 15, a predetermined light intensity is obtained on the image surface 17 at the corresponding scanning position. 19 represents a reference voltage generation circuit which generates a reference voltage corresponding to a predetermined laser reference output.

The output signals of the two polarized light components detected by the optical detectors 13 and 14 are amplified by first and second amplifiers 20 and 21, respectively and are combined again by an adding circuit 22. The resultant output of the adding circuit 22 is amplified by an amplifier 23 and is output as an APC signal. Since the reflection-transmission characteristics of the half mirror 11 depends on the polarization, if the laser beams emitted from the light sources have the identical intensity, the ratio of the polarized light components detected by the optical detectors 13 and 14 changes in accordance with the polarization state of the light incident upon the half mirror 11. To prevent this, at least one of the outputs of the polarized light components of the monitor light is amplified at a predetermined weighing-value as discussed below in detail, so that the change in the outputs of the optical detectors 13 and 14 which have been influenced by a change in the polarization state of the incident light upon the half mirror 11 can be corrected. Moreover, since the optical elements (polygonal mirror 15 or fθ lens 16) provided between the half mirror 11 and the image surface 17 have a polarization dependency though the dependency is less than that of the half mirror 11, if the weighing-value of the output(s) of the polarized light components is determined taking into account the polarization dependency of the optical elements located behind the half mirror 11, a more precise correction can be carried out. The polarization dependency of the half mirror 11 and other optical elements can be determined by a calculation (design) or measurement.

The corrected APC signal thus obtained is input to the light source power control circuit 18. This control circuit successively compares the APC signals of the respective semiconductor lasers with the reference voltage generated by the reference voltage generation circuit 19 at predetermined times which will be discussed hereinafter. The drive current for the light sources is controlled so that the intensity of the beam spot on the image surface 17 is at a predetermined level which is determined in accordance with the reference voltage. The power control circuit 18 independently holds the corrected APC signals for the semiconductor lasers and keeps the intensity level of each beam spot at a predetermined level.

As mentioned above, since the monitor light is split into two orthogonal linearly polarized light components, at least one of the outputs of these polarized light components is amplified taking into consideration the polarization dependency of the half mirror 11 and the outputs are combined again. Consequently, the sensor output of the monitor light is controlled such that the output signal intensity of the optical detectors of the monitoring light and the light intensity of the principal light on the image surface have a predetermined correlation. In other words, the imbalance of the light intensity between the output signal intensity of the monitor light and the light intensity of the principal light, caused by a change in the polarization state of the incident light onto the half mirror 11, can be corrected. Thus, the optical beam scanner of FIG. 1 is free from the influence of the polarization state of the light incident upon the half mirror 11 (optical beam splitter); hence, a precise APC operation can be carried out. Namely, the elements encircled by a phantom line A1 shown in FIG. 1 constitute a correction circuit for correcting the output of the monitor light which is influenced by the polarization dependency of the beam splitter (and the scanning optical system).

The polarization dependency correction system and the correction method are disclosed in detail in the U.S. Pat. No. 5,892,219 and will be also discussed below.

The polarization dependency of the half mirror 11 is influenced by the ambient humidity. To this end, the optical scanner shown in FIG. 1 includes a humidity sensor 24 in the vicinity of the half mirror 11. The humidity signal detected by the humidity sensor 24 is amplified by an amplifier 25 and is sent to a feedback circuit 26 connected to the correction circuit indicated by A1. The feedback circuit 26 is provided with a memory in which a humidity value when the half mirror 11 exhibits a predetermined polarization dependency is stored as a reference humidity. Moreover, the rate of change of the polarization dependency of the half mirror 11 when the humidity changes with respect to the reference humidity is obtained in advance and is stored in the feedback circuit 26. Namely, in the feedback circuit 26, it is possible to determine the change of the polarization dependency of the half mirror 11 when the humidity change occurs, with reference to the humidity signal input from the humidity sensor 24 and the stored date.

The feedback circuit 26 feeds the change in the polarization dependency of the half mirror 11 back to the correction circuit A1. Consequently, the correction circuit A1 adjusts the weighing-value for at least one of the two orthogonal light components of the monitor light (P-polarize light component and S-polarized light component), based on new polarization dependency characteristics of the half mirror 11 supplied to the correction circuit A1, so that the APC signal can be generated to keep the light intensity of the monitor light and the light intensity of the principal light on the image surface 17 at a predetermined relationship, regardless of the change in the humidity.

Note that in FIG. 1, the amplification factor is adjusted with respect to the output of the polarized light component (S-polarized light) detected by the optical detector 14 to thereby determine the weighing-value.

Namely, the elements encircled by a phantom line B1 in FIG. 1 constitute a correction circuit for correcting the humidity dependency of the half mirror 11. Thus the humidity dependency correction circuit B1 is associated with the polarization dependency correction circuit A1. Consequently, the outputs of the optical detectors 13 and 14 can be corrected so that the light intensity of the principal light on the image surface 17 and the intensity of the output signal of the monitor light detection means have a predetermined correlation, if the polarization state of the light incident upon the half mirror changes or the polarization dependency of the half mirror 11 changes due to the change in the humidity. Thus, the quantity of the principal light can be precisely controlled.

FIGS. 2 through 14 show an embodiment of light intensity control apparatus and method, according to the basic concept mentioned above. The light intensity control apparatus is applied to a multiple beam scanner in which eight laser beams are moved at one time, that is, eight scanning beams are formed in one scanning operation. The scanning optical system will be first explained below referring to FIGS. 2 through 5. In the following discussion, the "main scanning direction" refers to a scanning direction of the scanning beams in a plane perpendicular to the optical axis and the "sub-scanning direction" refers to a direction perpendicular to the main scanning direction in the plane perpendicular to the optical axis.

Figure 2:
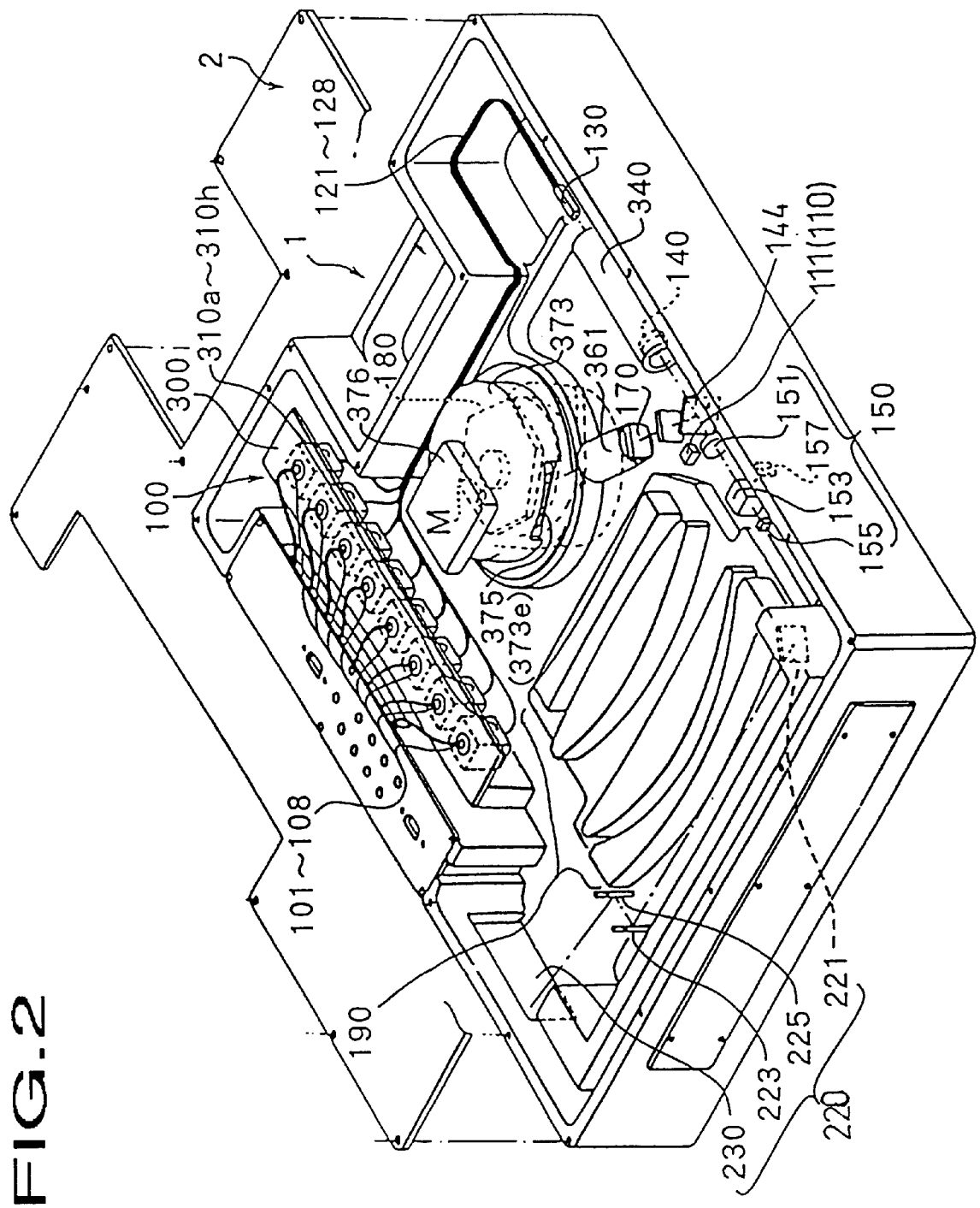
FIG. 2 is a perspective view of an optical scanner to which a light intensity control apparatus according to an embodiment of the present invention is applied.

The optical scanner is comprised of a scanning optical system provided in a casing 1 in the form of a substantially rectangular parallelepiped, as shown in FIG. 2. The upper opening of the casing 1 is closed by an upper lid 2 when the scanner is in use.

A light source 100 for the scanning system is composed of eight laser blocks 310a through 310h mounted to a support plate 300, semiconductor lasers 101 through 108 mounted to the respective laser blocks, eight silica glass optical fibers 121 through 128, coupling lenses (not shown) through which the laser beams emitted from the semiconductor lasers are made respectively incident upon the optical fibers 121 through 128, and a fiber alignment block 130 on which the eight optical fibers are held and aligned at the output ends thereof to form eight point light sources, as shown in FIGS. 2 through 5. The optical fibers 121 through 128 are held at their input ends by fiber holders 319a through 319h secured to the laser blocks 310a through 310h.

The divergent light emitted from the fiber alignment block 130 of the light source 100 is collimated by a collimating lens 140 which is held by a cylindrical collimating lens holder 340 and is made incident upon a half mirror 144 which constitutes an optical beam splitter through a slit 142. The light is partly transmitted through the half mirror 144 to provide monitor light and is partly reflected as principal light by the half mirror 144. The transmittance of the half mirror 144 is in the range of 5 to 10% on average for P-polarized light and S-polarized light.

The monitor light transmitted through the half mirror 144 is made incident upon an APC (Automatic Power Control) signal detector 150 which constitutes a light intensity control apparatus. The APC signal detector 150 is comprised of a condenser lens 151 which converges the transmission light, a polarization beam splitter 153 which splits the transmission light into two orthogonal polarized light components, an APC first light receiving element 155 which detects optical energy of one of the polarized light components, and an APC second light receiving element 157 which detects optical energy of the other polarized light component. The output signal of the APC signal detector 150 is used for a feedback control of the outputs of the semiconductor lasers 101 through 108.

A humidity sensor 111 which constitutes a humidity dependency correction portion 110 (FIGS. 11 and 12) is provided in the vicinity of the half mirror 144. The humidity signal detected by the humidity sensor 111 is picked up during the generation of the APC signal and is used for the feedback control of the laser output. The control process will be discussed below.

Figure 5:
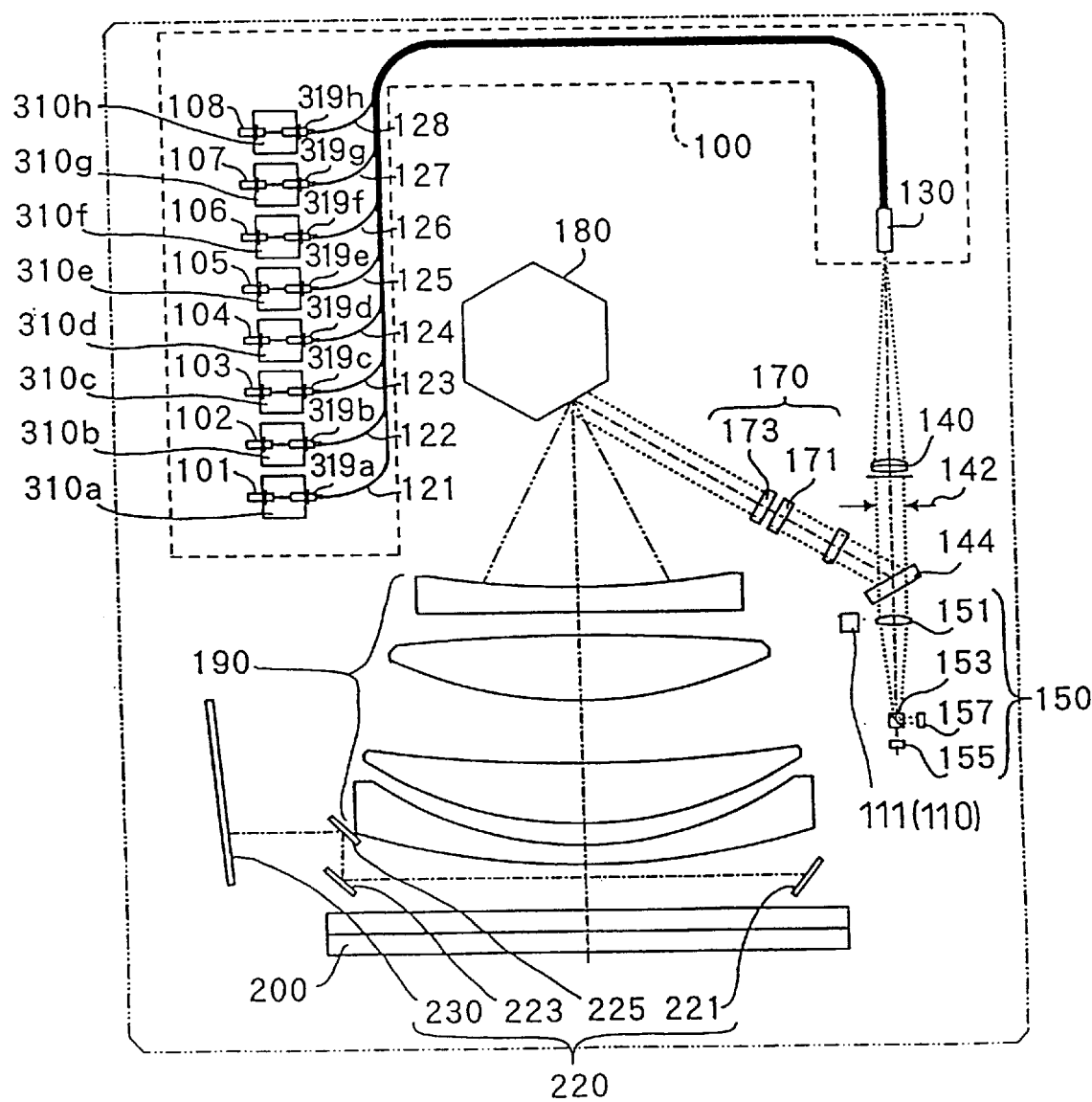
FIG. 5 is an explanatory view of an optical system of an optical scanner shown in FIG. 2 in the main scanning direction.

A cylindrical lens 170 is provided on the light path of the principal light reflected by the half mirror 144. The cylindrical lens 170 is held by a cylindrical lens holder 361 and is composed of two lens elements 171 and 173 which have respectively positive power and negative power in the sub-scanning direction, as shown in FIGS. 3 and 5.

Figure 3:
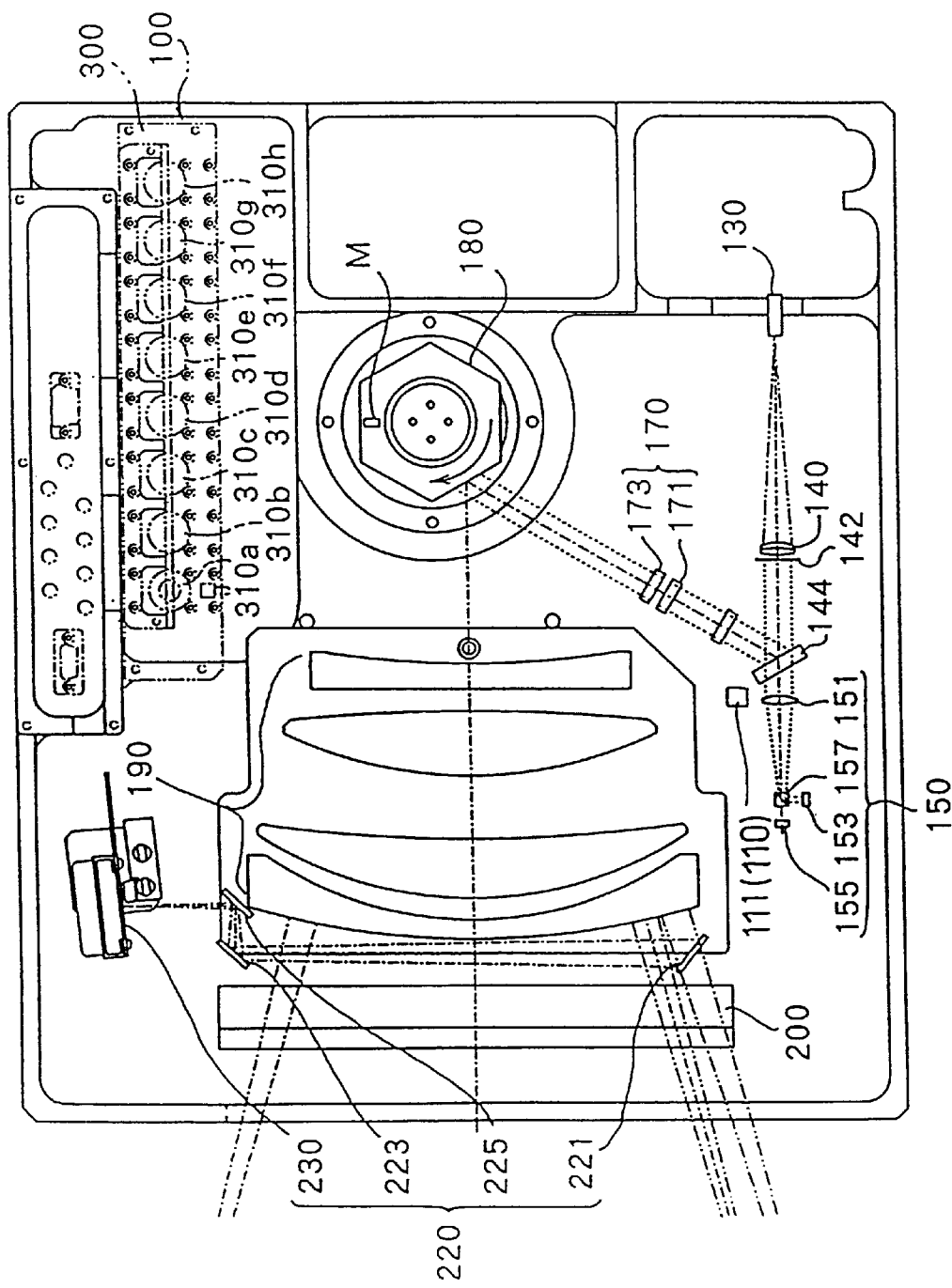
FIG. 3 is a plan view of an optical scanner shown in FIG. 2, in the main scanning direction.
Figure 4:
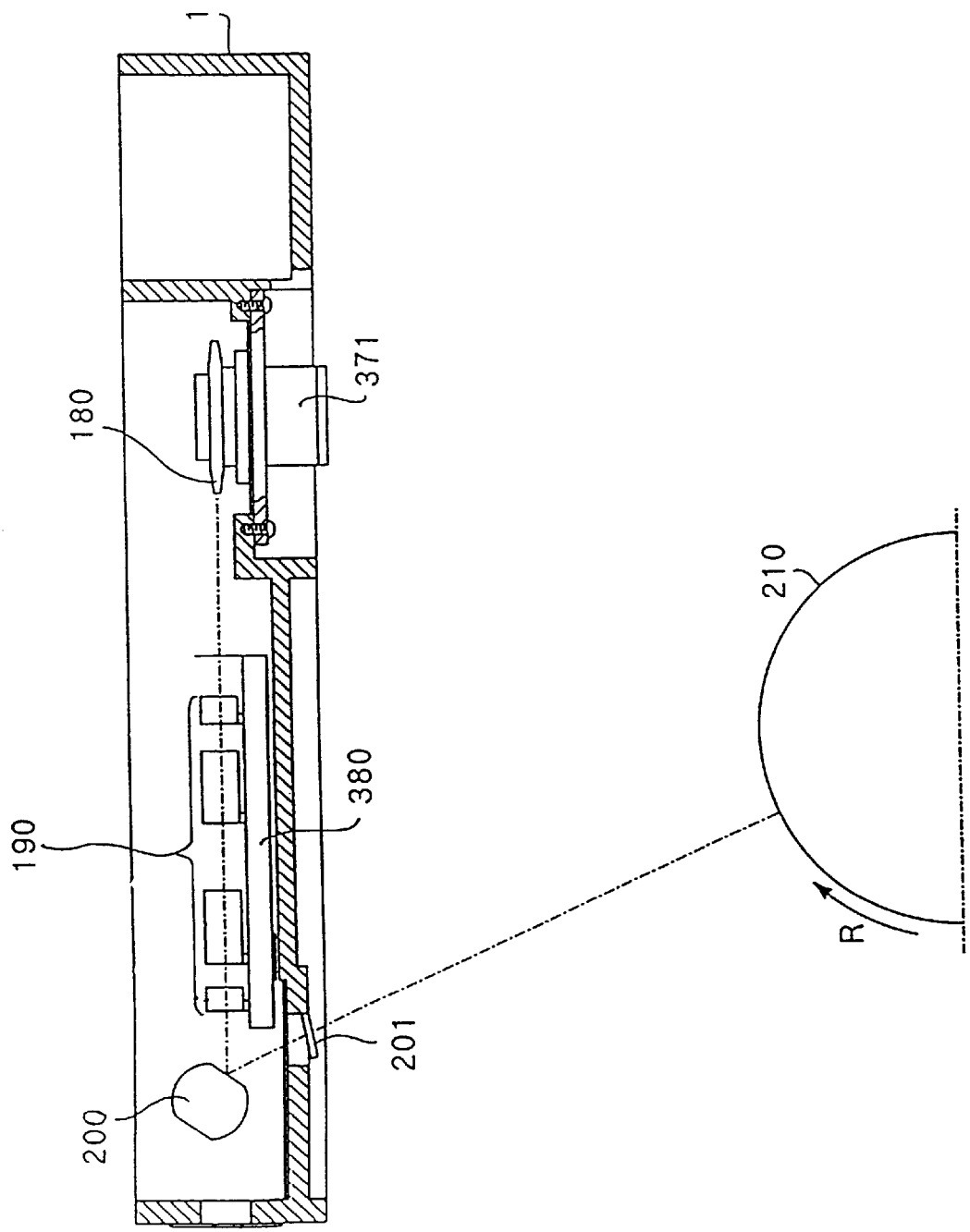
FIG. 4 is a sectional view of an optical scanner shown in FIG. 2 in the sub-scanning direction.

As can be seen in FIG. 4, the polygonal mirror 180 is driven to rotate in the clockwise direction as indicated by an arrow in FIG. 3 by a polygonal mirror motor 371 secured to the casing 1. The polygonal mirror 180 is isolated from the air outside by a polygonal mirror cover 373 in the form of a cup, as shown in FIG. 2, so that no whizzing sound is produced by the current of air caused by the rotation of the polygonal mirror 180 nor can the mirror surfaces be damaged by foreign matter such as dust which would otherwise collide with the mirror surface.

The polygonal mirror cover 373 is provided on the side surface thereof with a hole 373e which forms a light path and in which a glass cover 375 is fitted. The light transmitted through the cylindrical lens 170 is transmitted through the glass cover 375; is reflected and deflected by the polygonal mirror 180; and is emitted outside again through the glass cover 375. A sensor block 376 including an index sensor (not shown) to detect a mark M provided on the upper surface of the polygonal mirror 180 is provided above the polygonal mirror cover 373.

The light reflected by the polygonal mirror 180 is transmitted through an fθ lens 190 which forms an image forming optical system and is reflected by a reflection mirror 200 as shown in FIG. 4 toward the photosensitive drum 210 to form eight beam spots thereon. The beam spots are simultaneously moved in accordance with the rotation of the polygonal mirror 180 to form eight scanning beams, so that the photosensitive drum 210 can be scanned with the eight scanning beams in one scanning operation.

The photosensitive drum 210 is rotated in the direction R in synchronization with the movement of the scanning beam spots to form an electrostatic latent image on the photosensitive drum 210. The latent image is transferred onto a paper (not shown) via electrophotography per se known.

The light transmitted through the fθ lens 190 is detected by a synchronization signal detecting optical system 220 for each scanning operation via each reflection surfaces of the polygonal mirror prior to reaching the drawing area. The synchronization signal detecting optical system 220 composed of a first mirror 221 which is arranged in the light path between the fθ lens 190 and the reflection mirror 200 to reflect the light before the drawing area, second and third mirrors 223 and 225 which successively reflect the light reflected by the first mirror 221, and a light receiving element 230 which receives the light reflected by the third mirror 225. The light receiving element 230 is disposed at a position optically equivalent to the photosensitive drum 210. The eight scanning beams are successively incident upon the light receiving element 230 in accordance with the scanning operation, so that the light receiving element 230 generates eight pulses for one scanning operation. Upon detection of the pulses, image data for one line is transferred to the driver which drives the semiconductor laser corresponding to the pulses, so that the image is recorded after the lapse of a predetermined time from the detection of the pulses.

The multiple beam light source will be discussed below with reference to FIGS. 6 through 10.

Figure 6:
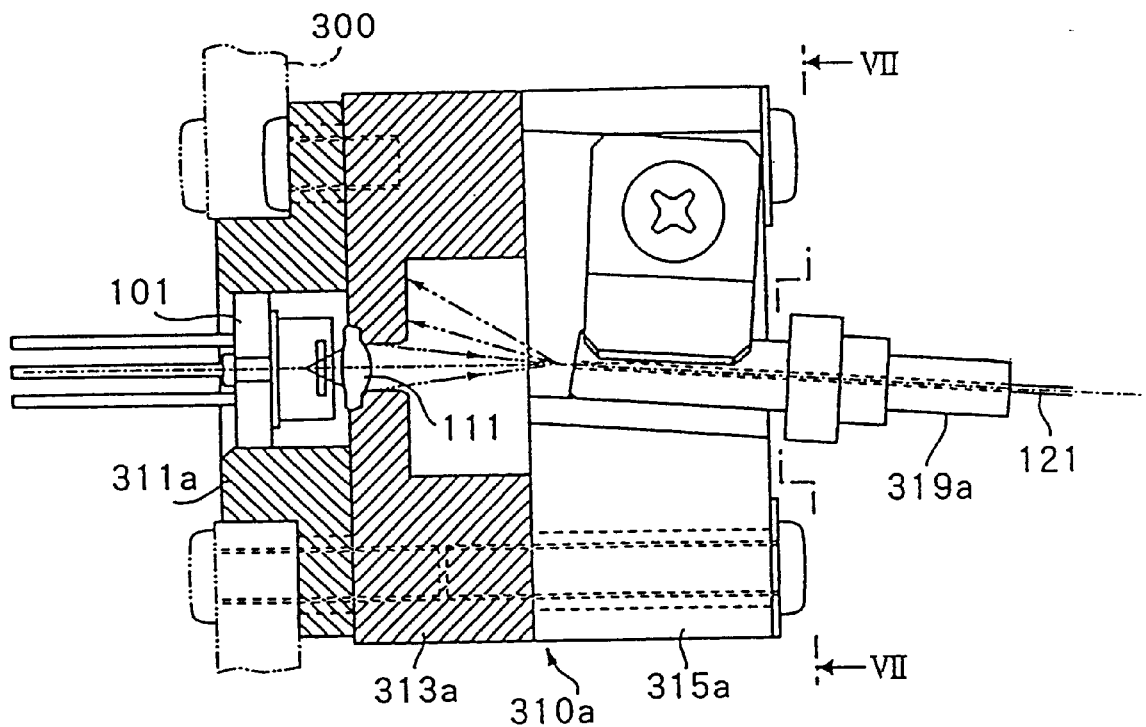
FIG. 6 is a sectional view of an laser block portion of an optical scanner shown in FIG. 2.
Figure 7:
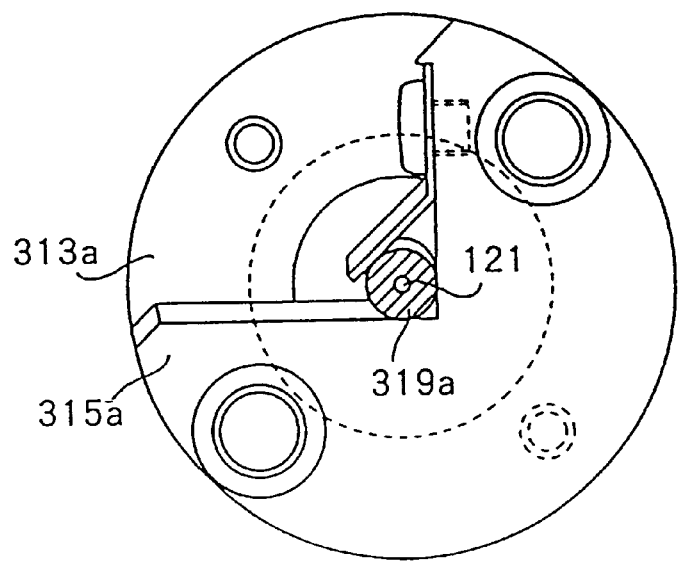
FIG. 7 is a sectional view taken along the line VII—VII shown in FIG. 6.

FIG. 6 shows a sectional view of the laser block 310a and FIG. 7 shows an end view viewed from the direction VII—VII in FIG. 6. The laser blocks 310a through 310h are identical and hence an explanation of only the laser block 310a is given below. The laser block 310a is comprised of a semiconductor laser holder 311a which holds the semiconductor laser 101, a coupling lens holder 313a which holds the coupling lens 111 and a fiber securing member 315a to which a fiber support 319a is secured.

The divergent light emitted from the semiconductor laser 101 is converged by the coupling lens 111 and made incident upon the optical fiber 121. The optical fiber 121 is inserted in and secured to a through hole formed in the fiber support 319a along the center axis thereof, by means of an adhesive.

In the embodiment illustrated in FIG. 6, the incidence end surface of the optical fiber 121 is inclined so that the incidence surface is not normal to the optical axis of the incident light. Also, the fiber support 319a is obliquely attached so that the light refracted by the inclined incidence surface fi the optical axis travels in the optical fiber 121 in parallel with the center axis of the optical fiber.

Due to the inclination of the incidence surface of the optical fiber 121 so as not to be normal to the optical axis, the light reflected by the incidence surface travels in the direction opposite to the direction of the incident light as shown in FIG. 6, and hence, no light can be returned to the semiconductor laser. If the reflected light is received by the semiconductor laser, the oscillation of the semiconductor laser becomes unstable, or the oscillation mode is changed from a single mode to a multiple mode, or the wavelength band of the oscillation is widened. Consequently, it is impossible to obtain a predetermined diameter of beam spot on the image surface, thus resulting in a deterioration of drawing quality. However, these problems can be eliminated by preventing the light from returning to the semiconductor laser.

Figure 8:
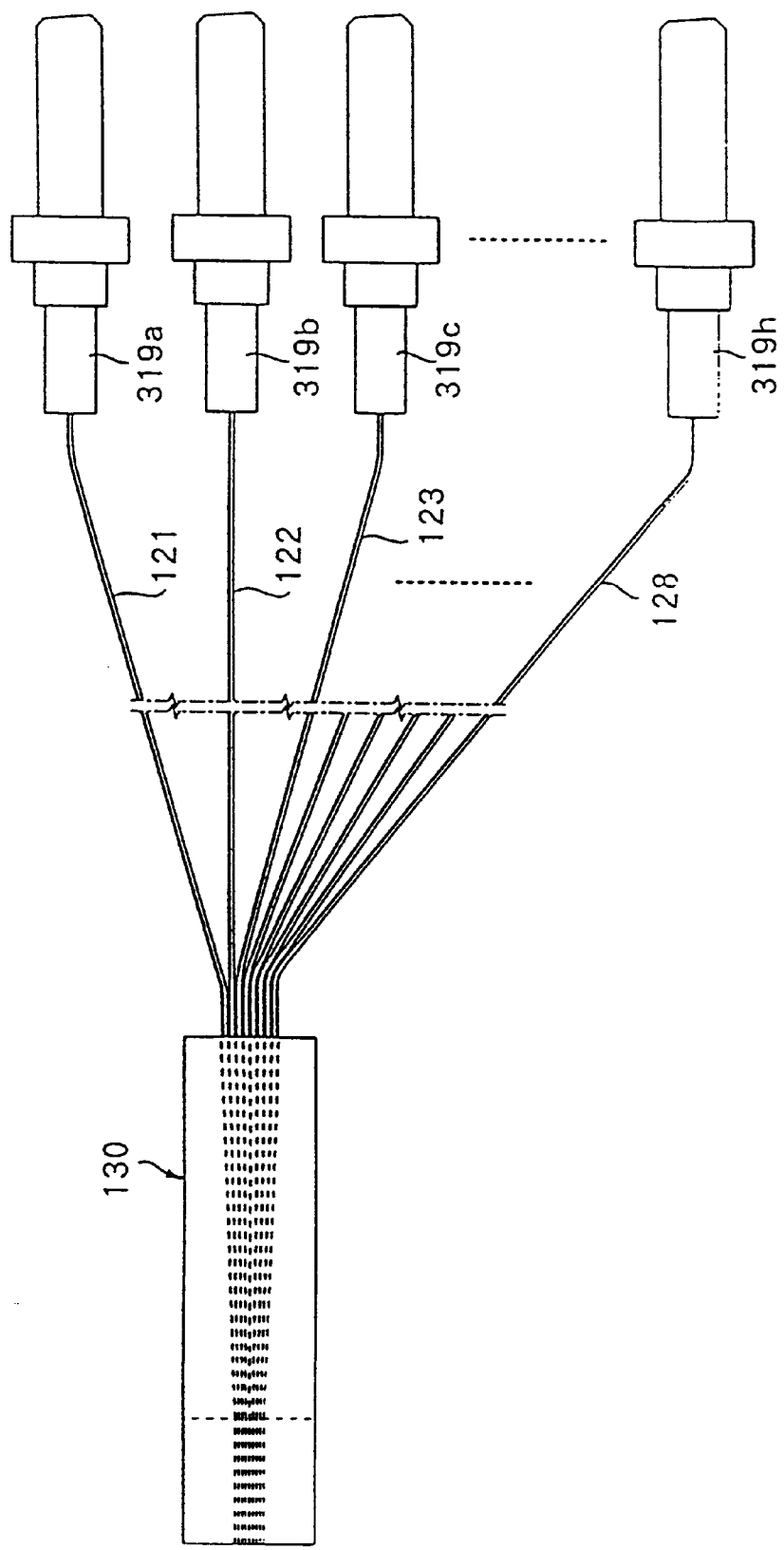
FIG. 8 is a plan view of components of an optical scanner provided between a fiber support and a fiber alignment block shown in FIG. 5.
Figure 9:
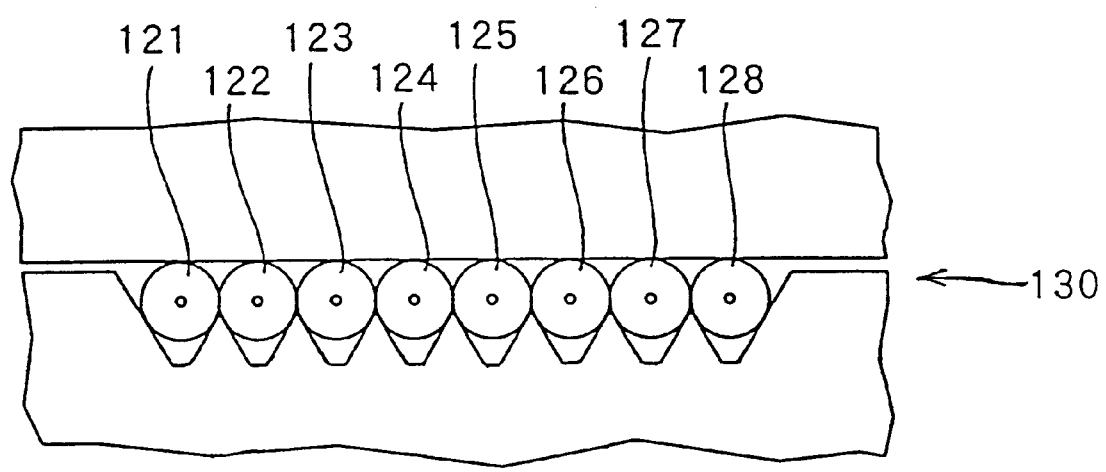
FIG. 9 is an enlarged front elevational view of a fiber alignment block.

The emission ends of the optical fibers 121 through 128 are connected together to the fiber alignment block 130, as shown in FIG. 8, so that the emission ends are aligned along a line, as shown in FIG. 9.

The fiber alignment block 130 is held by a holder (not shown) and is obliquely set so that the line connecting the centers of the optical fibers is inclined at a predetermined angle with respect to the main scanning direction, whereby the beam spots on the photosensitive drum 210 are spaced at a predetermined distance in the main scanning direction and the sub-scanning direction.

Figure 10:
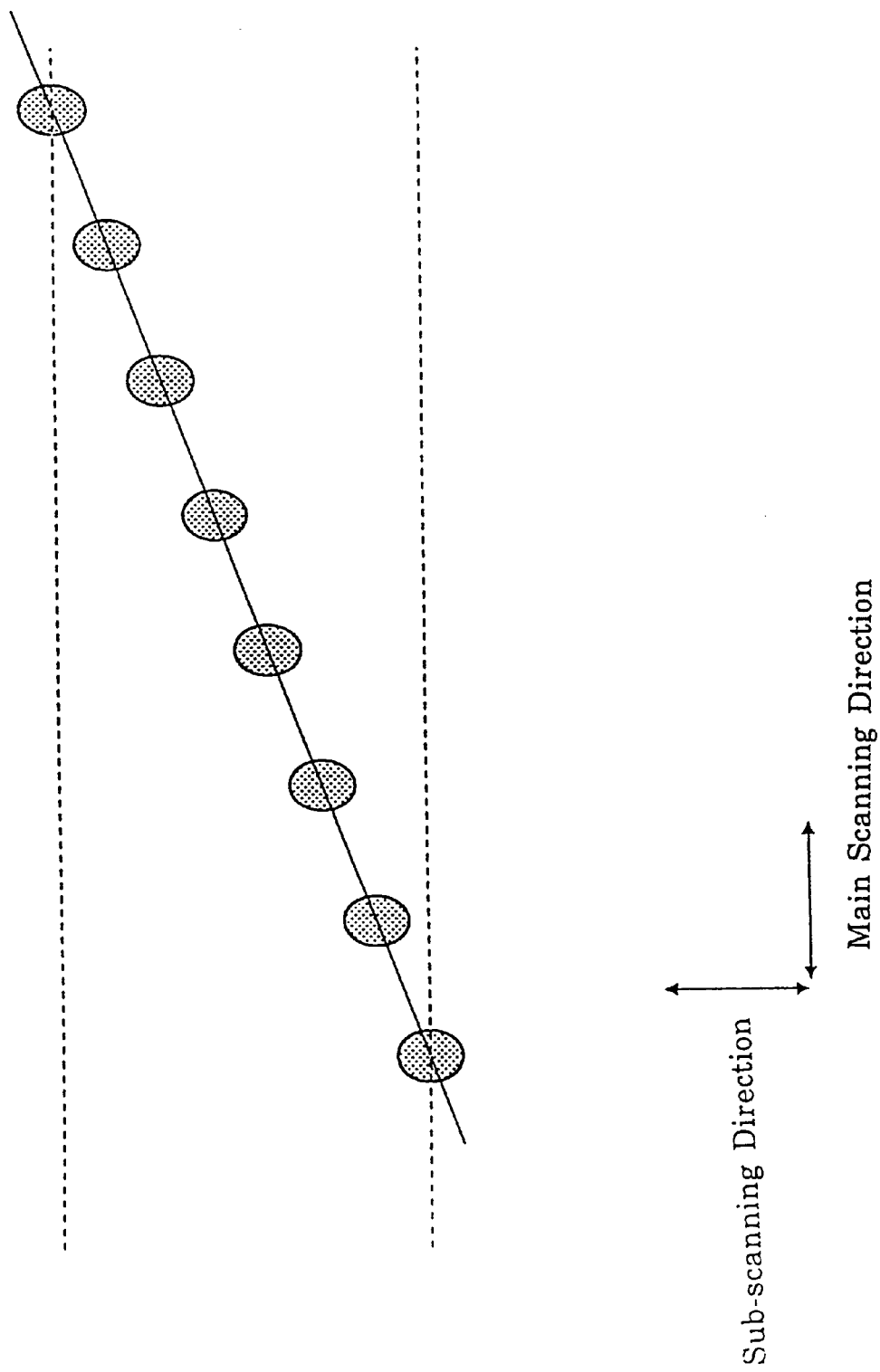
FIG. 10 is a schematic view of an arrangement of beam spots on a photosensitive body.

FIG. 10 shows an arrangement of the beam spots formed on the photosensitive drum 210 by way of example. The (centers of) beam spots are aligned along and on a straight line by disposing the end surfaces of the optical fibers corresponding to the object points on a straight line which is inclined with respect to the main scanning direction. The line connecting the centers of the beam spots forms a predetermined angle with respect to the main scanning direction. Consequently, the centers of the adjacent beam spots are spaced at a predetermined distance in the main scanning direction and the sub-scanning direction.

The APC signal detection portion 150 and the humidity dependency correction portion 110 which constitute the light intensity control apparatus contained in the optical scanner operate as follows: In general, an optical fiber has a property that changes the polarization state of the incident light, and the influence upon a change in the polarization state slightly varies depending on the holding state or extension state of the optical fibers. Consequently, in the arrangement in which the beams emitted from the semiconductor lasers are transmitted through the optical fibers, even if the polarization direction of the beams of the semiconductor lasers is identical on the incidence side, the polarization states of the beams emitted from the optical fibers are slightly different. Moreover, the polarization state varies depending on a change in the posture of the optical fibers or environmental conditions. Consequently, upon assembling, the various conditions tend to change to the extent that the polarization state of the beams changes.

The reflectance or transmittance of almost all optical elements that constitute the scanning system varies depending on the polarization state (polarization dependency). In particular, the half mirror 144 has a considerable polarization dependency. For example, if 7.5% of the entire quantity of light is used as monitor light, the transmittance of a typical half mirror 144 is approximately 10% for the P-polarized light and 5% for the S-polarized light. Therefore, for example, assuming that the light emitted from the first semiconductor laser and transmitted through the optical fiber is made incident upon the beam splitting surface of the half mirror as P-polarized light and the light emitted from the second semiconductor laser and transmitted through the optical fiber is made incident upon the beam splitting surface of the half mirror as S-polarized light, the ratio of the quantity of the two lights passing through the half mirror 144 is 2:1, even if the quantity of light emitted from the first semiconductor laser is identical to the quantity of light emitted from the second semiconductor laser.

If the feedback control of the quantity of light of the semiconductor laser is carried out based on the quantity of monitor light using the conventional APC so that the quantity of light transmitted through the half mirror 144 is identical, the quantity of light of the first semiconductor laser is one-half of the second semiconductor laser. If the polarization dependency of the optical elements between the half mirror and the photosensitive drum 210 is ignored, the maximum difference in the quantity of light between the beam spots on the photosensitive drum is double. Namely, the APC is carried out to make the quantity of light of the beam spots on the photosensitive drum identical, but nevertheless the APC could enhance the difference in the quantity of light if no polarization dependency of the half mirror is considered.

In an optical scanner for a printer, the quantity of light of the beam spots influences the density of the pattern to be printed and hence, if there is a difference in the quantity of light between the beam spots, it is impossible to obtain a desired density distribution. Consequently, for example, the density is not uniform at the portion of the pattern which is to be printed. This problem can be solved by removing the polarization dependency of the half mirror. However, if a half mirror which has a large difference between the reflectance and the transmittance is prepared, as in the illustrated embodiment, it is practically impossible to produce a surface whose polarization dependency is small in view of present thin film formation technology; it is possible to produce a half mirror having a small polarization dependency if the difference between the reflectance and the transmittance is small. However, if the difference between the reflectance and the transmittance is small, the utilization efficiency of the drawing principal light is reduced, so that if the output of the light source is relatively small, sufficient quantity of light for the drawing cannot be obtained. Conversely, if a light source of a greater output is used to obtain a sufficient quantity of light, the apparatus becomes costly.

Under these circumstances, in the illustrated embodiment of the present invention, the light transmitted through the half mirror 144 is split into two orthogonal polarized light components which are received by first and second APC light receiving elements 155 and 157 whose output signals Ss and Sp are weighted using the following equation (1) to obtain the APC signal S. Consequently, the output of each semiconductor laser is subject to the feedback control in accordance with the APC signal S. Thus, the above-mentioned problems with the polarization dependency can be eliminated. Note that * represents multiplication sign in the following equations.

$$S = K(Sp + k*Ss) \qquad (1)$$

wherein K represents the constant which is equal to 0.5 in the illustrated embodiment, and k represents the coefficient which can be calculated based on optical design data of the optical system using the following equation (2).

$$K = k1*k2 \qquad (2)$$

wherein k1=Mp/Ms, and k2=Ps/Pp

Alternatively, it is possible to experimentally obtain the coefficient k, using the optical system of a sampled light intensity control apparatus or it is possible to adjust and set the coefficient k for each apparatus. Mp and Ms represent the light intensity of the transmission light (monitor light) when the two linearly polarized lights having orthogonal oscillation directions of the electric field vector are incident upon the half mirror 144. Ps and Pp represent the light intensity of the reflection light (principal light) on the image surface. Representatively, P-polarized light which oscillates in a plane defined by the beam splitting surface (incidence surface) of the half mirror and S-polarized light which oscillates in a plane normal to the incidence surface can be used for measurement. The values (ratios) of k1 and k2 are calculated as design values or are obtained as measurement data.

Assuming that the beam splitting property of the polarization beam splitter 153 is perfect, the P-polarized light component incident upon the half mirror 144 is detected only by the first light receiving element 155 and the S-polarized light component incident upon the half mirror 144 is detected only by the second light receiving element 157.

The following discussion will be addressed to a comparison of the light intensity on the photosensitive drum when the output of the semiconductor lasers is controlled using the APC signal S which is obtained by the equation (1) and the light intensity on the photosensitive drum when the intensity of the monitor light is not corrected. It is assumed that the transmittances Ids and Hp of the half mirror 144 for the S-polarized light and P-polarized light are 5% and 10%, respectively, and the transmission loss due to the resultant polarization dependency of the optical elements between the half mirror 144 and the photosensitive drum 210, i.e., the cylindrical lens 170, the polygonal mirror 180, the fθ lens 190 and the reflection mirror 200 is 10% for the P-polarized light and 1% for the S-polarized light, respectively. Consequently, the rate Dp of the quantity of the P-polarized light that is reflected by the half mirror 144 and that reaches the photosensitive drum 210 is 90%. Likewise, the rate Ds of the quantity of the S-polarized light is 99%. In this case, the value of coefficient k (k1, k2) is given by k1=Mp/Ms=Hp/Hs=2 k2=Ps/Pp={(1−Hs) Ds}/{(1−Hp) Dp}≈1.16 k=k1*k2=2.32

Table 1 shows numerical values when the intensity of the monitor light detected by the light receiving element for the monitor light is directly used as a controlled variable for the APC. Table 2 shows numerical values when the APC controlled variable is obtained using the equation (1) S=K (Sp+k*Ss) in which the intensities Sp and Ss of the polarized light components of the monitor light detected by the light receiving elements 155 and 151 are substituted. Note that the APC is carried out to make the intensity of the P-polarized light and the circularly polarized light coincident with the intensity of the S-polarized light as a reference intensity. The incident lights are P-polarized and S-polarized lights having the largest difference in the transmittance and circularly polarized light having an intermediate property, by way of example. The numerical values of the intensity are represented by a percentage when the total quantity of light incident upon the half mirror is 1.

TABLE 1

|  | Monitor | APC | Light Intensity on Drum | |
| --- | --- | --- | --- | --- |
|  | Light Intensity | Control Amount | Without APC | APC in Operation |
| P-polarized Light | 0.100 | 0.100 | 0.810 | 0.405 |
| S-polarized Light | 0.050 | 0.050 | 0.941 | 0.941 |
| Circularly Polarized Light | 0.075 | 0.075 | 0.874 | 0.583 |

TABLE 2

|  | Monitor Light | | APC | Light Intensity on Drum | |
| --- | --- | --- | --- | --- | --- |
|  | Intensity | | Control | Without | APC in |
|  | Sp | Ss | Amount(S) | APC | Operation |
| P-polarized Light | 0.100 | 0.000 | 0.050 | 0.810 | 0.940 |
| S-polarized Light | 0.000 | 0.050 | 0.058 | 0.941 | 0.941 |
| Circularly Polarized Light | 0.050 | 0.025 | 0.054 | 0.874 | 0.939 |

In Table 1, when the P-polarized light and S-polarized light are incident on the half mirror, the maximum difference in the intensity on the photosensitive drum is approximately 2.3 (=0.941/0.405) in accordance with the operation of the APC. Consequently, it is impossible to obtain a desired density of a latent image formed on the photosensitive drum. Therefore, the apparatus is impracticable. In Table 2, the light intensities on the photosensitive drum are substantially identical in accordance with the operation of the APC, in spite of the change in the polarization state. In Table 2 which is free from the drawbacks in Table 1, the density of the latent image can be precisely controlled.

Although the change in the quantity of light on the photosensitive drum is restricted taking into account the polarization dependency of the half mirror 144 and the polarization dependency of the optical elements between the half mirror 144 and the photosensitive drum 210, it is possible to control the quantity of light, taking into account the half mirror 144 only, which has the most prominent polarization dependency. In this case, the APC signal S is obtained by the following equation (3), wherein the symbols correspond to those in equation (1) or (2).

$$S=K(Sp+k1*Ss) \quad (3)$$

If 5–10% of the total quantity of light are used as monitor light, the intensity ratio of the monitor light (S-polarized light=5%, P-polarized light=10%) is approximately 2 depending on the polarization direction, and the intensity ratio of the principal light after the monitor light is split, is approximately 1.06 (S-polarized light=95%, P-polarized light=90%). Comparing with the monitor light which has a small quantity ratio, the change in the intensity of the principal light depending on the polarization is small. Consequently, a correction of the quantity of light in connection only with the polarization dependency of the transmittance of the half mirror 144 is effective.

Table 3 shows numerical data similar to those shown in Table 2, when the APC is carried out, taking into account only the polarization dependency of the half mirror 144. In Table 3, the ratio of the polarized light components are identical, regardless of the APC operation (with or without the APC operation). This is because it is assumed that the total quantity of light incident upon the half mirror 144 is constant. If the total quantity of light changes, the light intensity after the change occurs is maintained as it is, in case of an absence of the APC, but the light intensity can be controlled to be identical to the level shown in Table 3 by the APC operation.

TABLE 3

| | Monitor Light | | APC | Light Intensity on Drum | |
|---|---|---|---|---|---|
| | Intensity | | Control | Without | APC in |
| | Sp | Ss | Amount(S) | APC | Operation |
| P-polarized Light | 0.100 | 0.000 | 0.050 | 0.810 | 0.810 |
| S-polarized Light | 0.000 | 0.050 | 0.050 | 0.941 | 0.941 |
| Circularly Polarized Light | 0.050 | 0.025 | 0.050 | 0.874 | 0.874 |

As can be seen from the foregoing, if the output of the semiconductor laser is controlled taking into account the polarization dependency of the half mirror 144 only, the intensity difference on the photosensitive drum is approximately 1.16 (=0.941/0.810), thus resulting in a distinct advantage, in comparison with the case shown in Table 1.

Thus, the monitor light is split into light components of different polarization directions, so that the power of the light source can be controlled taking into account the difference in the polarization state for each beam, obtained from the rate of the polarized light components. Consequently, the intensity of the output signal of the monitor light detection means always has a predetermined correlation with the light intensity of the principal light on the image surface, thus leading to a precise APC operation.

However, the polarization dependency of the half mirror 144 varies depending on the humidity. For instance, in the case that the monitor light is split into P-polarized light and S-polarized light, even if the polarization state and quantity of the incident beams are identical, the light intensity detected by the first light receiving element 155 can be different from that detected by the second light receiving element 157 due to a change in humidity. Therefore, under conditions wherein the humidity changes, the correction method in which the polarization dependency of the half mirror is set to be constant is not useful.

For instance, in the case wherein the half mirror 144 which permits around 10% of the P-polarized light or around 5% of the S-polarized light to pass therethrough is used, it is assumed that the transmittance of the P-polarized light changes to approximately 12% and the transmittance of the S-polarized light changes to approximately 3%, due to a change in the humidity (i.e., 7.5% of the total monitor light pass through the half mirror). In this case, the APC controlled variables which are obtained for each incident light (i.e, the P-polarized light, the S-polarized light and the circularly polarized light) using the set value of the coefficient k (=2.32), and the adjusted light intensities on the image surface are shown in Table 4 below. Note that the quantity of the P-polarized light, the S-polarized light and the circularly polarized light have the same power at the light source. The conditions of the half mirror other than the polarization dependency characteristics are identical to those in Table 2.

TABLE 4

| | Monitor Light | | APC | Light Intensity on Drum | |
|---|---|---|---|---|---|
| | Intensity | | Control | Without | APC in |
| | Sp | Ss | Amount(S) | APC | Operation |
| P-polarized Light | 0.120 | 0.000 | 0.060 | 0.792 | 0.462 |
| S-polarized Light | 0.000 | 0.030 | 0.035 | 0.960 | 0.960 |
| Circularly Polarized Light | 0.060 | 0.015 | 0.047 | 0.876 | 0.653 |

As can be understood from the above discussion, if the APC is carried out in accordance with the originally set optical data, when the polarization dependency of the half mirror 144 changes due to a change in the humidity, the difference in the light intensity on the photosensitive drum between the P-polarized light and the S-polarized light is approximately double at the maximum, which is not practicable. This is because the originally set transmittances (Hp, Hs) of the half mirror 144 for each polarized light component or the originally set rates (Dp, Ds) of the polarized light components that reach the photosensitive drum 210 (i.e., the coefficient k) are used without adjusting the same taking into account the humidity dependency of the half mirror 144.

To solve this problem, according to the present invention, provision is made for a humidity dependency correction portion 110 which detects a change in the polarization dependency characteristics of the half mirror 144 due to a change in the humidity to carry out the feedback control of the generation of the APC signal S. To this end, the humidity when the half mirror 144 has a predetermined polarization dependency is set as a reference humidity. For example, in the illustrated embodiment, the humidity when the transmittances of the half mirror 144 for the P-polarized light and the S-polarized light are 10% and 5%, respectively, corresponds to the reference humidity. The value determined based on the polarization dependency of the optical elements defines the initial value of the coefficient k in the equation (1). Moreover, the humidity dependency of the half mirror 144, i.e., the variation of the polarization dependency of the half mirror 144 when the humidity changes from the reference humidity is obtained in advance using design values or measurement data, etc., and is stored in the humidity dependency correction portion 110. Consequently, if the ambient humidity changes, the variation of the humidity is multiplied by the stored rate of the polarization dependency of the half mirror 144 to determine the change in the polarization dependency characteristics of the half mirror 144 (i.e., the change in the transmittance for the P-polarized light and S-polarized light).

The humidity dependency correction portion 110 detects the ambient humidity of the half mirror 144 within the casing 1 using the humidity sensor 111 provided in the vicinity of the half mirror 144. The detected humidity is compared with the reference humidity, so that a change in the polarization dependency characteristics of the half mirror 144 can be specified based on the signal which represents the humidity difference and the rate of the polarization dependency of the half mirror 144 which is obtained in advance. The change of the polarization dependency thus obtained is fed back to the circuit which calculates the APC signal S. In connection with equation (1), the coefficient k is re-set based on the newly specified polarization dependency of the half mirror 144, so that the APC signal S can be determined based on the reset coefficient k.

For example, it is assumed that the transmittances Hs and Hp for the S-polarized light and the P-polarized light change from 5% to 3% and from 10% to 12%, respectively. The change in the transmittance can be detected through the humidity data of the humidity sensor 111. The new transmittances Hs and Hp are substituted in the equation (2). The quantity rates Dp and Ds of the P-polarized light and S-polarized light, that reach the photosensitive drum 210 can be obtained, based on the change in the transmittances Hs and Hp of the half mirror 144, and the quantity loss (set value) of the polarized light components caused by the optical elements between the half mirror 144 and the photosensitive drum 120. Therefore, the new coefficient k can be obtained by monitoring the ambient humidity of the half mirror 144. In this example, $k \approx 4.85$. Table 5 below shows the APC controlled variables which are obtained by substituting the coefficient k that has been corrected in accordance with the change, in the polarization dependency of the half mirror in equation (1) and the adjusted light intensity on the image surface, under the same conditions as those in Table 4.

TABLE 5

| | Monitor Light | | APC | Light Intensity on Drum | |
|---|---|---|---|---|---|
| | Intensity | | Control | Without | APC in |
| | Sp | Ss | Amount(S) | APC | Operation |
| P-polarized Light | 0.120 | 0.000 | 0.060 | 0.792 | 0.964 |
| S-polarized Light | 0.000 | 0.030 | 0.073 | 0.960 | 0.960 |
| Circularly Polarized Light | 0.060 | 0.015 | 0.067 | 0.876 | 0.955 |

As can be seen from the foregoing, a means for detecting the change in the polarization dependency characteristics of the half mirror 144 is provided, so that the weighing-value for at least on of the outputs of the light receiving elements 155 and 157 is reset in accordance with the value of the change so as to correct the beam power on the photosensitive drum when the APC operation is carried out to the same extent as the result shown in Table 2. Note that in Table 5, although the APC signal S is obtained using equation (1), the correction method in which only the change in the polarization dependency characteristics of the half mirror 144 is taken into account, as discussed with reference to equation (3) can be used. In the correction method, the change (transmittances Hp, Hs) in the polarization dependency characteristics of the half mirror 144 which is obtained by the humidity dependency correction portion 110 is fed back to minimize the influence by the change of the humidity.

The structure and operation of the control system of the optical scanner as constructed above will be discussed below with reference to FIG. 11.

The control system is composed of a central control unit 400 which generally controls the entire apparatus, a timing signal generation circuit 410 which generates drawing timing signals, a drawing signal generation circuit 420 which converts externally input drawing data into drawing signals (dot data for each scanning line) and outputs the same, laser driving circuits 451 through 458 which drives the semiconductor lasers 101 through 108 in accordance with the drawing signals, an APC signal generation circuit 430 which generates the APC signals in accordance with the outputs of the first and second light receiving elements 155 and 157, and a switching circuit 440 which selectively supplies the APC signals to the laser driving circuits 451 through 458.

The central control unit 400 drives the polygonal mirror motor 371 to rotate the polygonal mirror 180 and drives the drum motor 211 to rotate the photosensitive drum 210 at a constant speed. The central control unit 400 determines the reflection surface of the polygonal mirror by which the current or subsequent scanning operation is or is to be carried out next, in accordance with the detection signal of the polygonal mirror sensor 374 which detects the mark M provided on the polygonal mirror 180. Also, the central control unit 400 detects the irregularity in the rotation of the photosensitive drum in accordance with the detection signal of the drum sensor 213 which detects the rotational speed of the photosensitive drum 210.

The timing signal generation circuit 410 generates first, second and third timing signals after the first reflection surface of the polygonal mirror is switched to a second reflection surface thereof adjacent to the first reflection surface, upon completion of a scanning operation.

The first timing signal is used to individually and successively emit light from the semiconductor lasers 101 through 108 so as to produce the APC signals and is supplied to the laser driving circuits 451 through 458 and the switching circuit 440. The APC signal generation circuit 430 detects the outputs of the semiconductor lasers which successively emit the light in accordance with the outputs of the first and second light receiving elements 155 and 157. The APC signal generation circuit 430 fetches the data which represents the change in the polarization dependency of the half mirror 144 from the humidity dependency correction portion 110 and outputs the APC signals of the semiconductor lasers in accordance with the fetched data.

The switching circuit 440 selects the corresponding laser drive circuit to which the APC signal output from the APC signal generation circuit 430 is to be supplied in accordance with the first timing signal. For example, for a certain period of time in which the light is emitted from the first semiconductor laser 101, the switch SW1 is turned ON, so that the output APC signal is supplied to the first laser drive circuit 451. The gains of the laser drive circuits 451 through 458 are set such that the output of each semiconductor laser is at a reference level, in accordance with the APC signals input thereto.

The second timing signal is used to simultaneously emit the light from all the semiconductor lasers to thereby obtain a horizontal synchronization signal and is supplied to each of the laser drive circuits 451 through 458. Since the light emitted from the semiconductor lasers 101 through 108 and incident upon the light receiving element 230 for detecting the synchronization signal is split in the main scanning direction, even if a simultaneous light emission from the semiconductor lasers 101 through 108 takes place, the beams reach the synchronization signal detection light receiver 230 at different times.

The third timing signal consists of horizontal synchronization pulses for each scanning line, which are generated by detecting the signals output from the synchronization signal detection light receiver 230 and is supplied to the drawing signal generation circuit 420. The drawing signal generation circuit 420 supplies the drawing signals to the laser drive circuits 451 through 458 after the lapse of a predetermined time from the receipt of each horizontal synchronization signal to commence the drawing operation.

Figure 12:
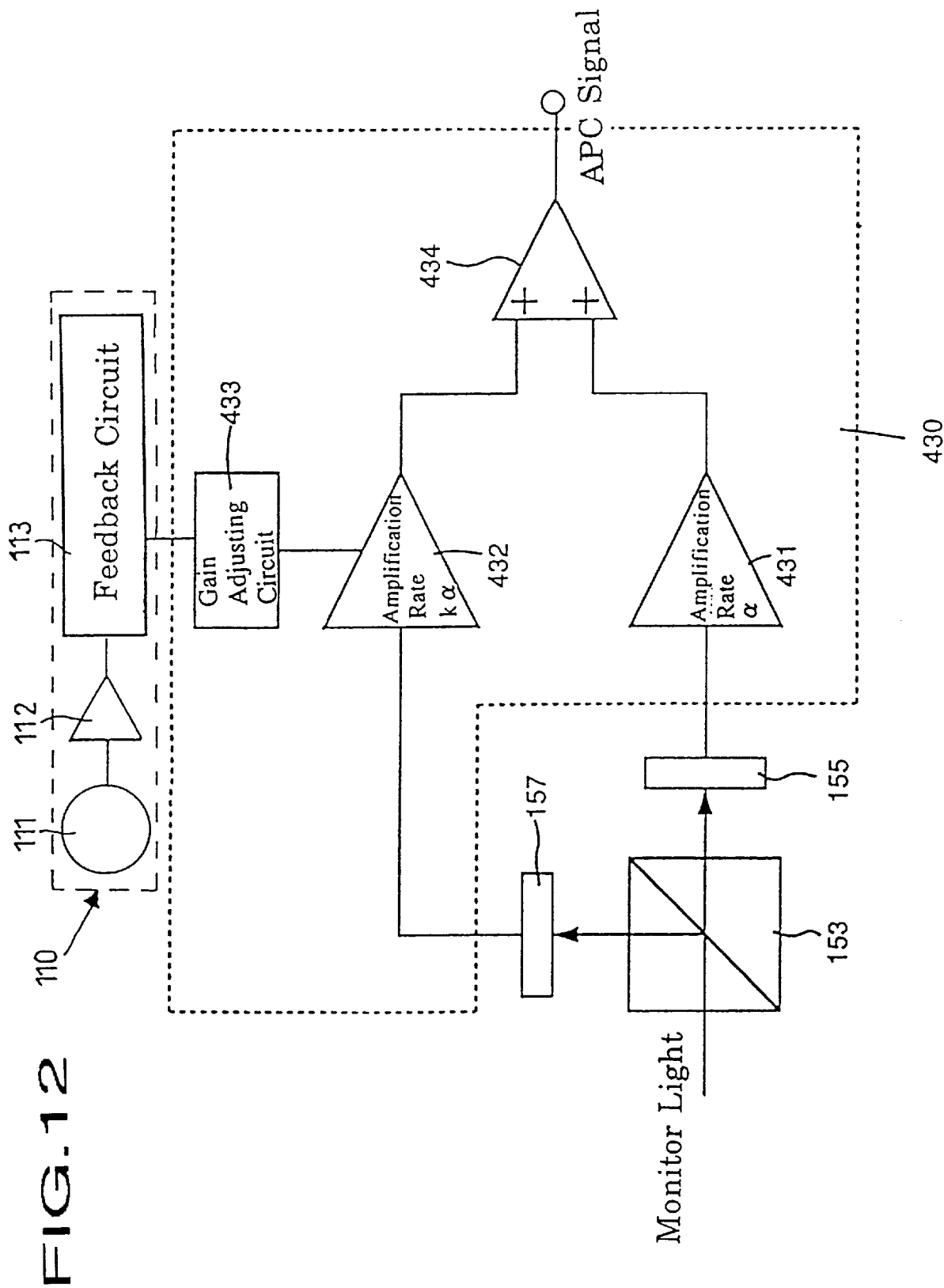
FIG. 12 is a block diagram of an APC signal generation circuit and an humidity dependency correction circuit, shown in FIG. 11.

As can be seen in FIG. 12, the APC signal generation circuit 430 is comprised of a first amplifier 431 which amplifies the output of the first light receiving element 155 which receives one of the linearly polarized light components transmitted through the half mirror 144 and split by the polarization beam splitter 153, i.e., the-P-polarized light component at an amplification rate α, and a second amplifier 432 which amplifies the output of the second light receiving element 157 which receives the S-polarized light component at an amplification rate kα, a gain adjusting circuit 433 which adjusts the gain of the second amplifier 432 by adjusting the coefficient k of the amplification rate, and an adding circuit 434 which adds the outputs of the first and second amplifiers 431 and 432 to produce the APC signal. It is possible to predetermine the coefficient k which is adjusted by the gain adjusting circuit 433 as a design value, or it is possible to set the value k upon assembling and adjustment of each apparatus. When the value k is determined, the humidity dependency characteristics of the half mirror 144 at the reference humidity are taken into account. As mentioned above, the APC signal S can be obtained using equation (1) in which the output voltages Sp and Ss of the light receivers 155 and 157 are appropriately amplified (multiplied by K).

Figure 11:
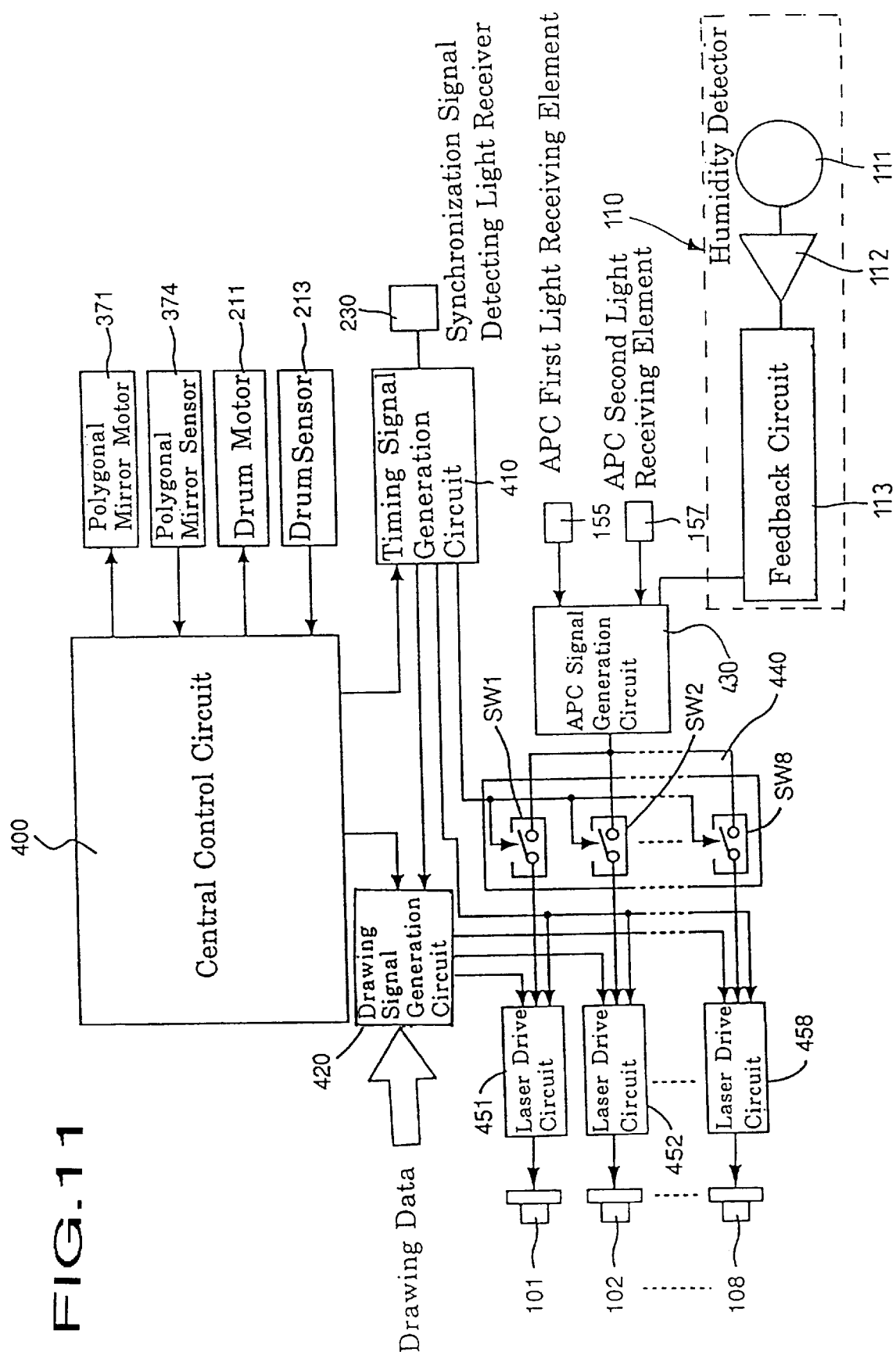
FIG. 11 is a block diagram of a control system for an optical scanner.

FIGS. 11 and 12 shows the detail of the humidity dependency correction portion 110. The humidity dependency correction portion 110 is composed of a humidity signal amplifier 112 which amplifies the humidity data detected by the humidity detection sensor 111, and a feedback circuit 113 which specifies the variation in the polarization dependency characteristics of the half mirror 144 in accordance with the output of the humidity signal amplifier 112 and feeds the variation back to the gain adjusting circuit 433. The gain adjusting circuit 433 resets the weighing-value (coefficient k) of the output of the S-polarized light component, in accordance with the input variation in the polarization dependency.

Namely, the feedback circuit 113 outputs control signal for varying the coefficient k by the gain adjusting circuit 433, based on the variation in humidity with respect to a reference humidity (an increase or a decrease) and the change in humidity. For example, if the beam splitter possesses characteristics such that the reflectance of the S-polarized increases as the humidity increases; if the humidity increases, the feedback circuit 113 outputs a control signal which indicates to what extent the gain adjusting circuit 433 has reduced the coefficient k. Based on this control signal, the gain adjusting circuit 433 resets the coefficient k to be smaller than the current value, so as to keep the APC signal at a certain level regardless of the increase of the humidity in the vicinity of the half mirror 144.

Conversely, if the humidity decreases, the feedback circuit 113 outputs control signal so that the gain adjusting circuit 433 resets the coefficient k at a larger value.

As mentioned above, since the humidity dependency correction portion 110 is associated with the APC signal generation circuit 430, the output of the light receiving elements 155 and 157 are adjusted so that the light intensity of the principal light on the photosensitive drum 210 and the intensity of the output signal of the monitor light detection means have a predetermined correlation if the polarization dependency of the half mirror 144 varies depending on the change in humidity, in addition to the change in the polarized state of the incident light upon the half mirror 144. Thus, the APC operation can be precisely carried out.

Figure 13:
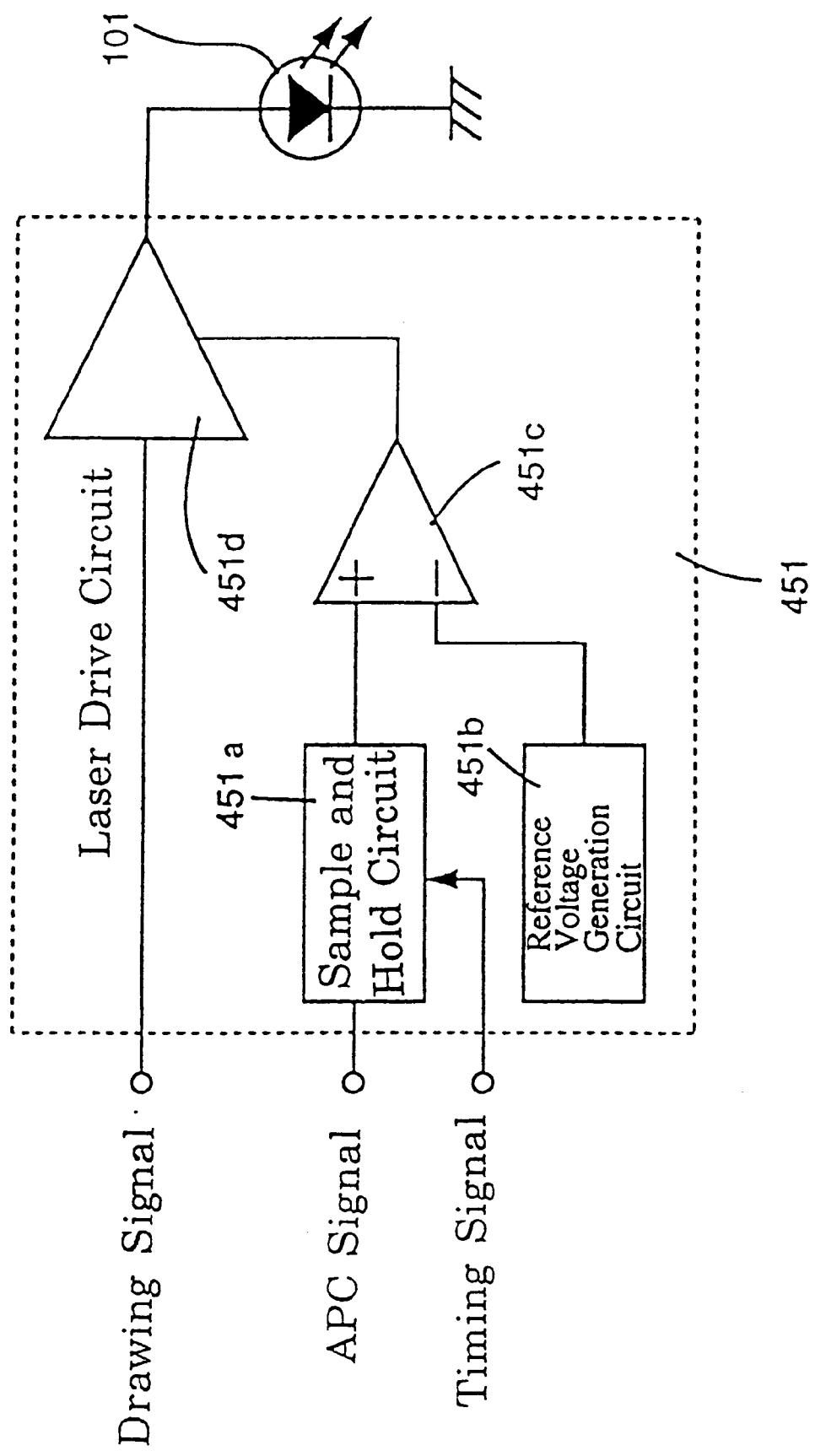
FIG. 13 is a block diagram of a laser drive circuit shown in FIG. 11.

The structure of the laser drive circuit 451 is shown in FIG. 13. A sample-and-hold circuit 451a samples and holds the APC signal output from the APC signal generation circuit 430 in synchronization with the operation of the switch Sw1 when the first timing signal is input thereto from the timing signal generation circuit 410. A reference voltage generation circuit 451b generates a reference voltage corresponding to a predetermined reference output of the semiconductor laser.

A differential amplifier 451c calculates a difference between the sampled and held signal and the reference voltage, so that the gain of a laser drive circuit 451d can be set in accordance with the difference signal. The laser drive circuit 451d controls the operation of the semiconductor laser 101 in accordance with the drawing signal input from the drawing signal generation circuit 420. The drive current can be controlled based on the gain set by the differential amplifier 451c. Consequently, the laser drive circuit 451 controls the output of the semiconductor laser so that the intensity of the beam spot on the photosensitive drum is identical to the reference level.

Note that the other laser drive circuits 452 through 458 are identical to the laser drive circuit 451. Namely, the output of the corresponding semiconductor lasers are controlled based on the output of the APC signal generation circuit 430 and the semiconductor lasers 102 through 108 are driven in accordance with the drawing signals.

Figure 14:
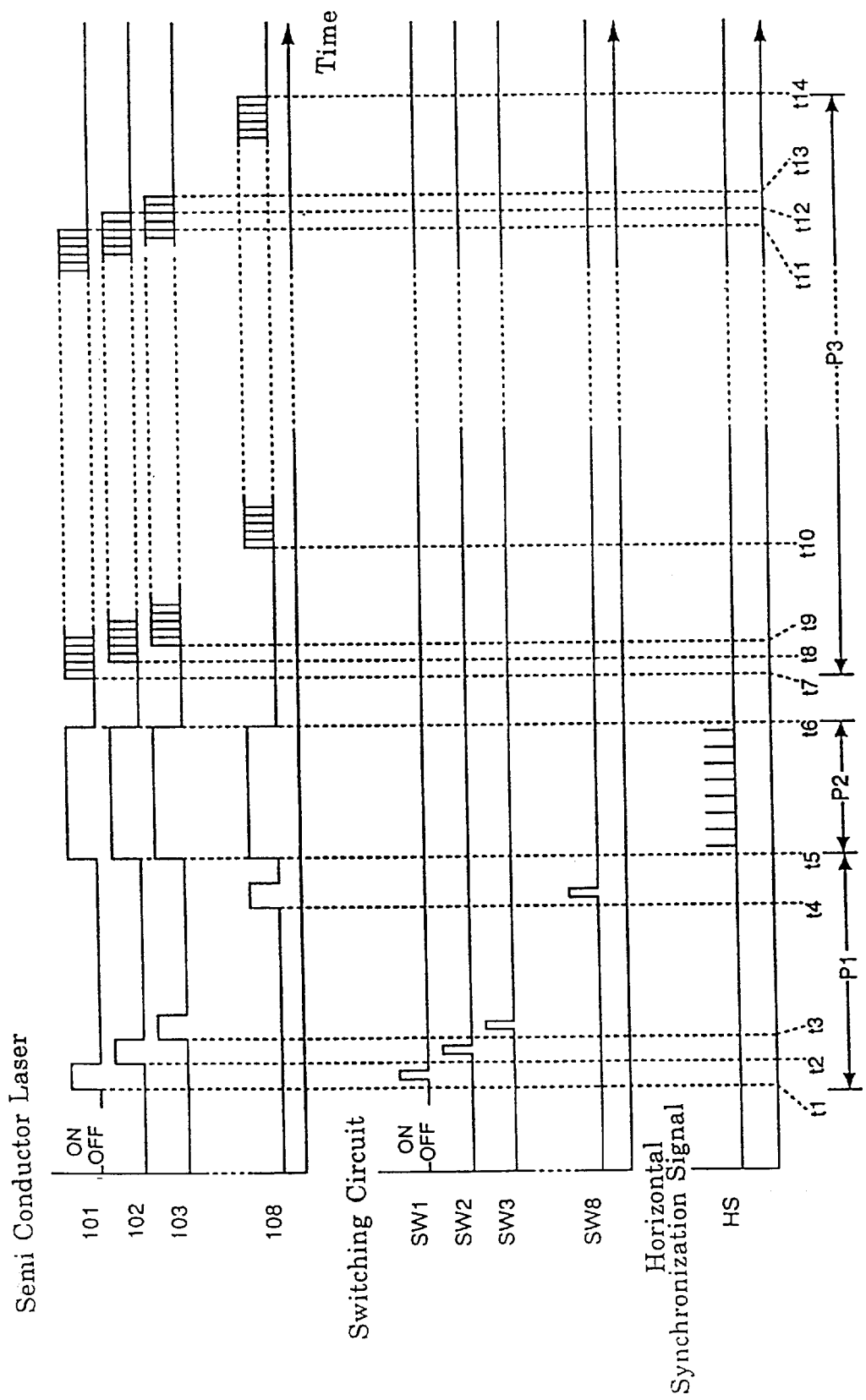
FIG. 14 is a timing chart showing the operations of an optical scanner.

FIG. 14 shows a timing chart of the operation of the control system in one scanning operation. In this timing chart, the ON/OFF state of the semiconductor lasers 101 through 108, the ON/OFF state of the switches SW1 through SW8 of the switching circuit 440, the timing of the output of the horizontal synchronization signals HS are represented on the time axis.

The time for one scanning operation can be divided into three sections consisting of a first section P1 in which the output of each semiconductor laser is adjusted, a second section P2 in which the horizontal synchronization signal is detected, and a third section P3 in which a pattern is actually drawn on the photosensitive drum 210.

In the first time section P1, the semiconductor lasers are chronologically switched to emit the light, so that the corresponding switches of the switching circuit 440 are turned ON within the emission time of the respective semiconductor lasers to thereby input the APC signals output from the APC signal generation circuit 430 into the corresponding laser drive circuits. For instance, the semiconductor laser 101 emits the light in the period of time between the times t1 and t2 in the timing chart and the semiconductor laser 102 emits the light in the period of time between the times t2 and t3, respectively. The corresponding switches SW1 and SW2 are turned ON in the respective periods of time. The laser drive circuit controls the control level of the drive voltage so that the quantity of light corresponding to the reference level can be obtained on the photosensitive drum.

In the second time section P2, the eight semiconductor lasers 101 through 108 simultaneously emit the light in the period of time between the times t5 and t6, so that when the light is received by the horizontal synchronization signal detection light receiver 230, the eight horizontal synchronization pulses are generated for each scanning line.

In the third time section P3, the ON/OFF operation of the semiconductor lasers are controlled in accordance with the drawing signals at a predetermined timing after the lapse of a predetermined time from the generation of each horizontal synchronization pulse to form a predetermined pattern on the photosensitive drum. Among the eight scanning lines which are simultaneously produced, the first scanning line is formed by controlling the semiconductor laser 101 in the period of time between the times t7 and t11. Likewise, the second scanning line, the third scanning line and the eighth scanning line are formed by controlling the semiconductor lasers 102, 103 and 108 in the periods of time between the times t8 and t12, between the times t9 and t13 and between the times t10 and t14, respectively. Since the beam spots formed by the light emitted from the semiconductor lasers are spaced from one another in the main scanning direction, a drawing operation is commenced after a predetermined amount of scanning has been executed by the preceding beam spot, so that the scanning lines on the photosensitive drum 210 can be aligned in the main scanning direction.

In the illustrated embodiment, since the correction is carried out depending on the polarization state of the incident light upon the half mirror 144 with reference to the intensity of the output signal (APC signal S) of the S-polarized light, only the coefficient k in connection with the intensity of the output signal of the S-polarized light is reset based on a change in the humidity. However, the present invention is not limited to this correction method.

Figure 15:
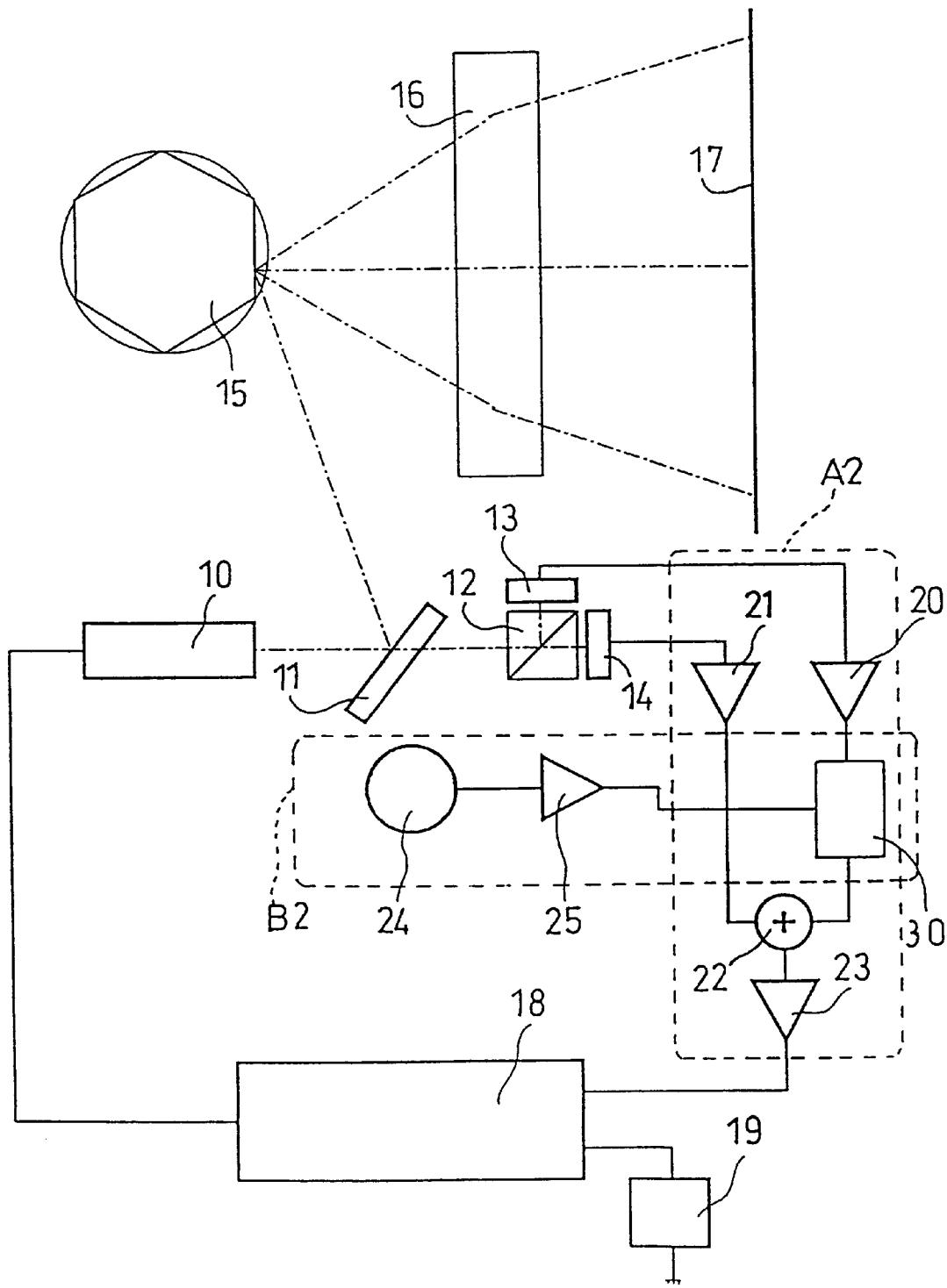
FIG. 15 is a schematic view of a light intensity control apparatus according to another embodiment of the present invention.

Alternatively, for instance, it is possible to vary the intensity of the output signal of the P-polarized light component of the split light, depending on the change in the humidity. In this alternative, the humidity dependency correction portion is constructed as shown in FIG. 15 which shows an optical scanner similar to that shown in FIG. 1. In FIG. 15, the monitor light is split into the orthogonal P-polarized and S-polarized light components by the polarization beam splitter 12. The quantity of the P-polarized light component is detected by the optical detector 13 and the quantity of the S-polarized light component is detected by the optical detector 14, respectively. In the humidity dependency correction circuit B2, the humidity representation signal which is detected by the humidity detection sensor 24 and is amplified by the amplifier 25 is produced and is supplied to the feedback circuit 30. The feedback circuit 30 is connected to the first amplifier 20 which adjusts the output of the optical sensor 13 for the P-polarized light component in the polarization dependency correction circuit A2. In this state, if a change in the humidity occurs upon generation of the APC signal, the intensity of the output signal of the P-polarized light component of the monitor light is adjusted by the first amplifier 20 and is combined again with the output signal representative of the S-polarized light component in the adding circuit 22.

Figure 16:
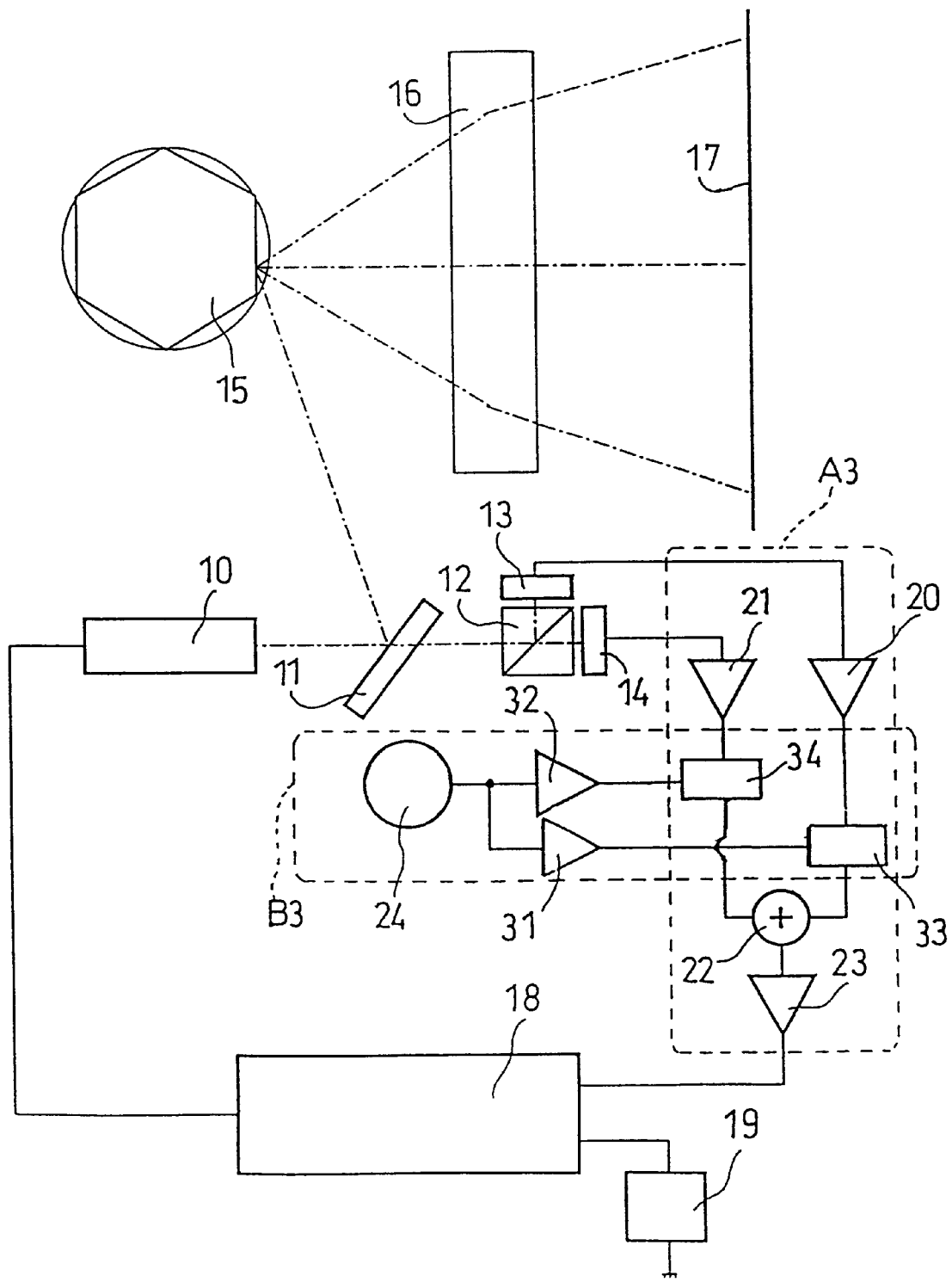
FIG. 16 is a schematic view of a light intensity control apparatus according to another embodiment of the present invention.

FIG. 16 shows another embodiment of an optical scanner. The humidity dependency correction circuit B3 shown in FIG. 16 is provided with two amplifiers 31 and 32 which amplify the output of the humidity detection sensor 24. The output terminals of the amplifiers 31 and 32 are connected to the feedback circuits 33 and 34, respectively. The feedback circuit 33 is connected to the second amplifier 21 for the S-polarized light component in the polarization dependency correction circuit A3. The feedback circuit 34 is connected to the first amplifier 20 for the P-polarized light component. In this state, the intensities of the output signals of the P-polarized light component and the S-polariz ed light component of the monitor light are simultaneously adjusted depending on a change in the polarization dependency of the half mirror 11 which is specified through the humidity detection sensor 24 to thereby correct the humidity dependency.

Namely, the humidity dependency correction means is not limited to those shown in FIGS. 2 through 14. In short, the APC signal which is obtained by re-combining the output signals of the polarized light components of the split monitor light is adjusted taking into account the change in humidity.

Figure 17:
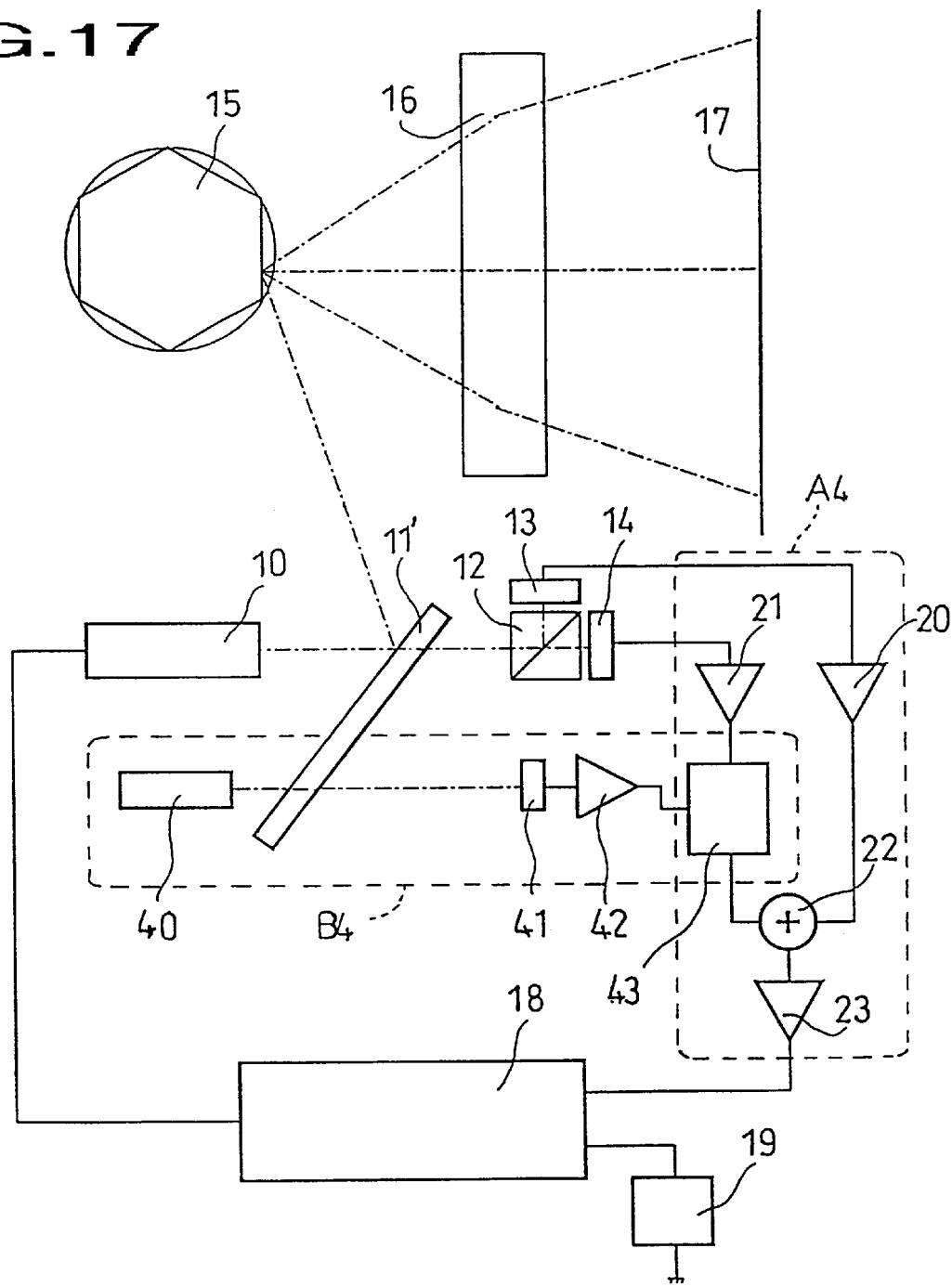
FIG. 17 is a schematic view of a light intensity control apparatus in which the humidity dependency is corrected using reference light, according to the present invention.

The following discussion will be addressed to another embodiment of a light intensity control apparatus of the present invention with reference to FIG. 17. The beam scanner shown in FIG. 17 is substantially identical to that shown in FIG. 1, except for the humidity dependency correction circuit B4.

In the optical scanner shown in FIG. 17, the humidity detection sensor as a means for detecting the change in the polarization dependency of the half mirror 11' due to the change in the humidity is replaced with a reference light source 40 separate from the multiple beam light source 10. The reference light source 40 is placed so that the reference light is made incident upon the half mirror 11' at the same incident angle and in the same direction as those of the light emitted from the multiple beam light source 10. No polarization of the reference light produced by the reference light source 40 changes depending on the environmental conditions. Moreover, a fixed light path for the reference light is established between the light source 40 and the half mirror 11' by a member other than an optical fiber or the like which tends to vary the polarization state of the reference light depending on the arrangement or the way of placement thereof, etc.

The reference light is split into reflected light and transmitted light by the half mirror 11' similar to the light emitted from the multiple beam light source 10. The reflected reference light (not shown) is interrupted in the vicinity of the half mirror 11' so as not to have influence on the scanning of the principal light by the polygonal mirror 15. The quantity of the transmitted reference light is detected by a reference light detector 41 provided behind the half mirror 11'. The reference light detection sensor 41 detects individually the quantity of the P-polarized light component and the S-polarized light component. The output signal representative of the quantity of the transmitted reference light detected by the reference light detector 41 is amplified by an amplifier 42 and supplied to a feedback circuit 43. Since the reference light is free from a change in the polarization before it reaches the half mirror 11', the change in the quantity of the transmitted reference light detected by the reference light detector 41 represents a change in the polarization dependency of the half mirror 11'. Since the change in the polarization dependency of the half mirror 11' depends on the change in ambient humidity, the feedback circuit 43 resultantly detects the influence by the change in the humidity.

The feedback circuit 43 feeds the variation of the polarization dependency of the half mirror 11' supplied from the reference light detector 41 back to the polarization dependency correction circuit A4. In response thereto, the correction circuit A4 resets the weighing-value for at least on of the P-polarized light component and the S-polarized light component, based on the variation of the polarization dependency of the half mirror 11' input thereto, and produces the APC signal by adjusting the output(s) of the optical detectors 13 and 14 for detecting the quantity of light, so that the intensity of the output signal of the monitor light and the light intensity of the principal light on the image surface 17 are well-balanced so as to have a predetermined correlation, regardless of the change in the humidity. Thereafter, the output of the light source is adjusted using the APC signal thus obtained by the light source power control circuit 18 and the reference voltage generation circuit 19. Consequently, not only polarization dependency but also humidity dependency can be corrected.

Note that in the control apparatus, the amplification factor of the output of the S-polarized light component detected by the optical sensor 14 is adjusted to reset the weighing-value.

Figure 18:
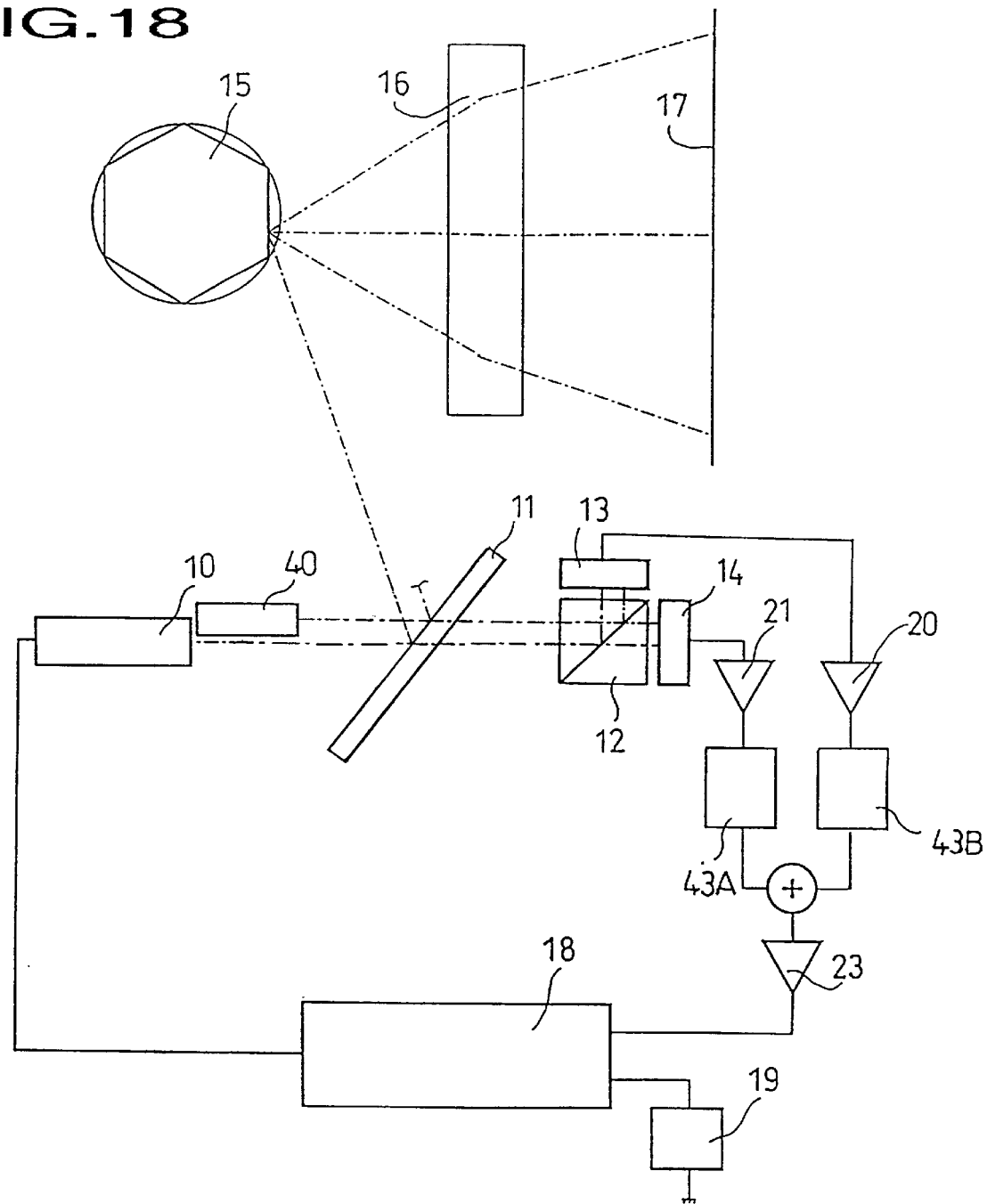
FIG. 18 is a schematic view of a light intensity control apparatus in which monitor light and reference light are received by a same light receiver.
Figure 19:
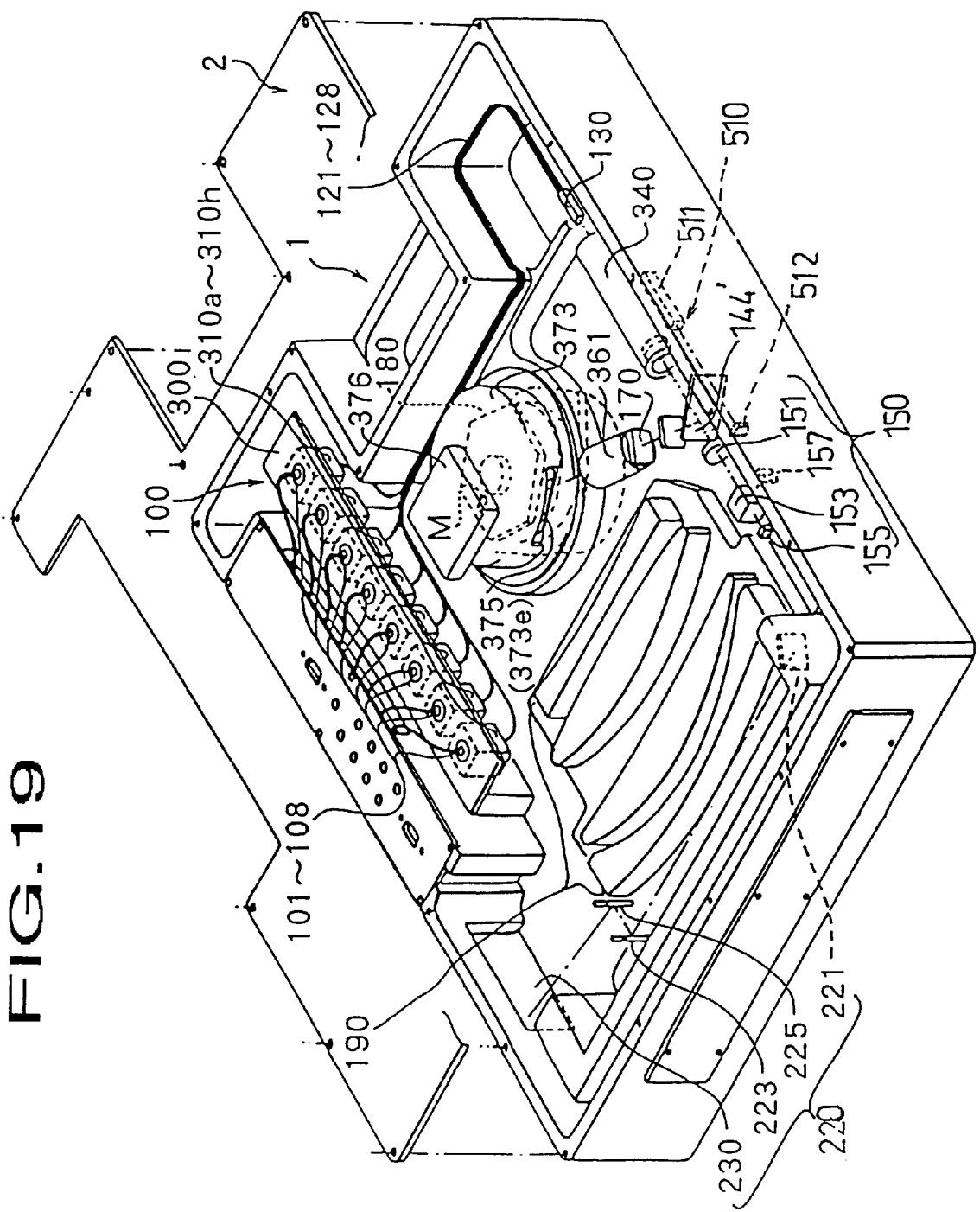
FIG. 19 is a perspective view of an optical scanner having a light intensity control apparatus in which reference light is used, according to the present invention.
Figure 20:
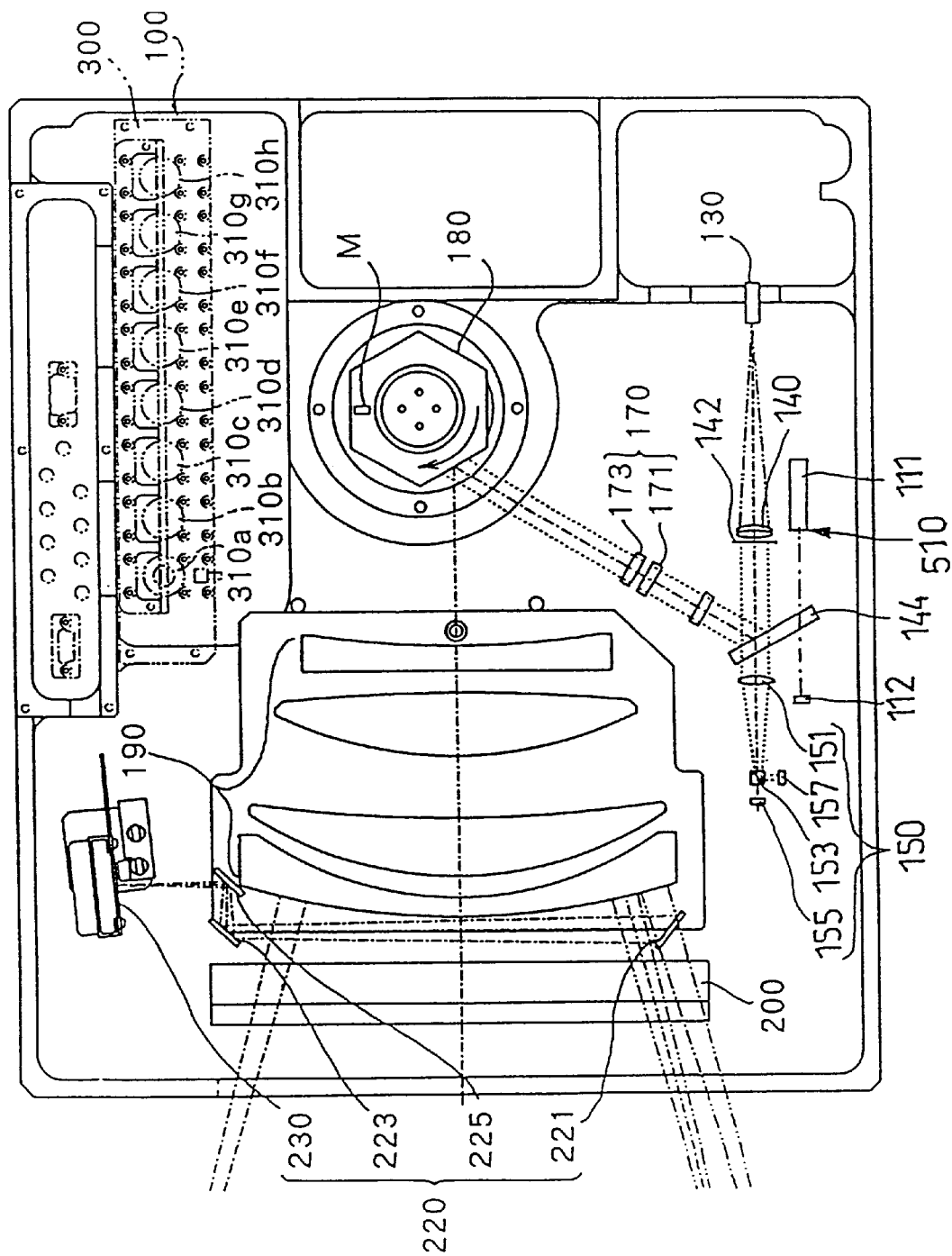
FIG. 20 is a plan view of an optical scanner shown in FIG. 19.
Figure 21:
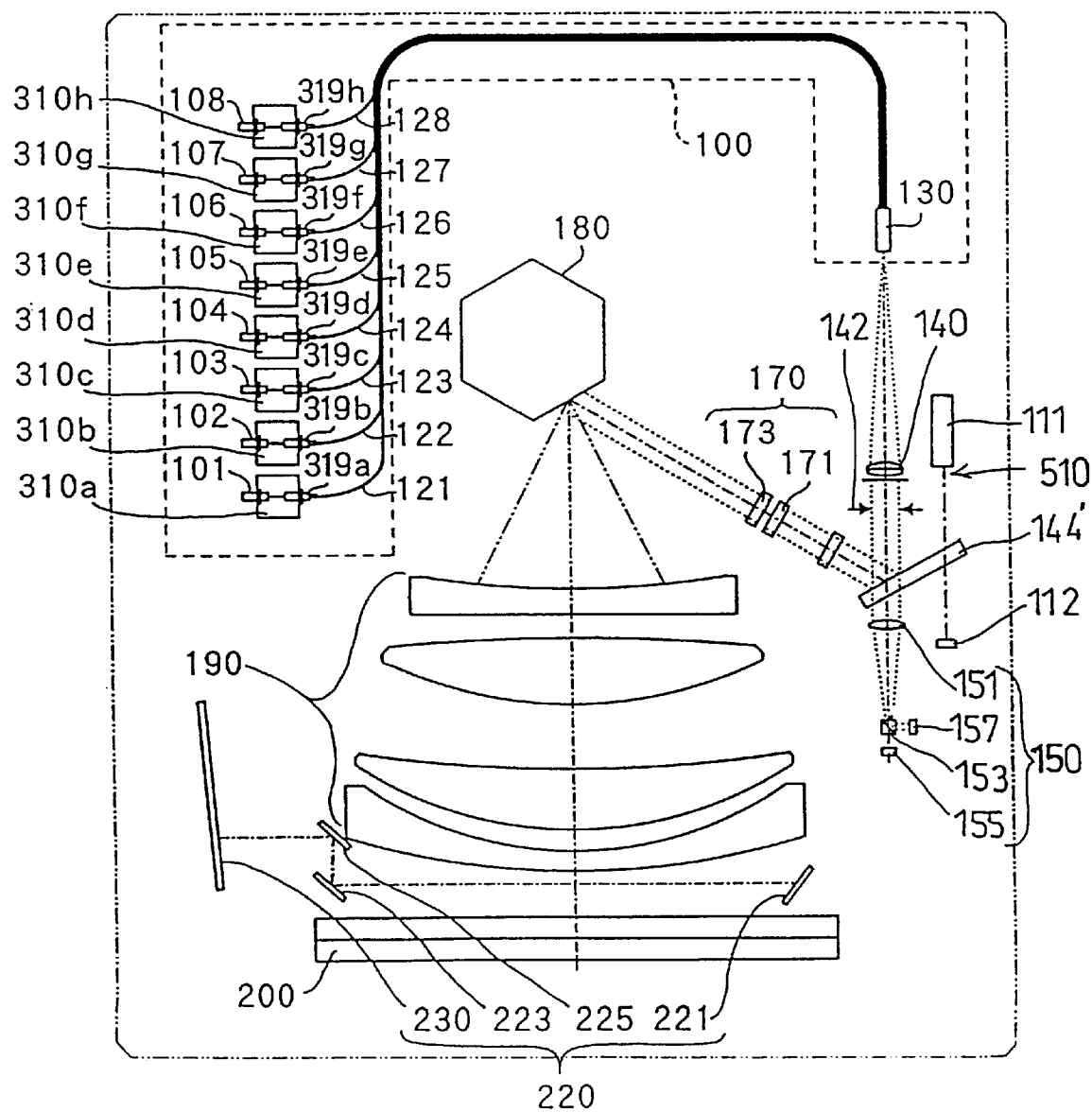
FIG. 21 is an explanatory view of an optical system of an optical scanner shown in FIG. 19, in the main scanning direction.

In the light intensity control apparatus shown in FIG. 17, a reference light detection sensor 41 is provided in addition to the optical sensors 13 and 14 for detecting the quantity of monitor light. Alternatively, it is possible to detect the transmitted reference light using the optical sensors 13 and 14, as shown in FIG. 18. The reference light source 40 is placed so that the reference light is incident upon the polarization beam splitter 12. The reference light is split into a P-polarized light component and a S-polarized light component, which are detected by the sensors 13 and 14. In the control, the emission of the scanning light and the emission of the reference light take place at different times. For example, the reference light source 40 first emits the reference light, so that the variation of the polarization dependency of the half mirror 11' with respect to the reference value can be detected for the P-polarized light and the S-polarized light. The outputs of the detectors are amplified by the amplifiers 20 and 21 and are fed to and held in the feedback circuits 43A and 43B. Thereafter, the multiple beam light source 10 operates to emit light, and the held variation of the polarization dependency of the half mirror 11' is fed back, so that the outputs of the sensors 13 and 14 for the monitor light are recombined at a predetermined weighing-value to produce the APC signal.

FIGS. 19 through 23 show an example of an optical scanner having a light intensity control apparatus shown in FIG. 17. The structure of the optical scanner is the same as that shown in FIGS. 2 through 14, except for the humidity dependency correction portion 510. No duplicate explanation of the like components will be given below.

A reference light source 511 which constitutes the humidity dependency correction portion 510 is provided in the vicinity of the half mirror 144'. The reference light source 511 generates the reference light separately from the semiconductor lasers 101 through 108. The reference light is emitted toward the half mirror 144' in the same direction as the fiber alignment block 130. The reference light source 511 produces the reference light always at the same polarization. The light path between the reference light source 511 and the half mirror 144' is formed by a member other than an optical member such as an optical fiber which could vary the polarization of the reference light. Namely, the reference light is incident upon the half mirror 144' at the same incident angle and in the same direction as those of the eight laser beams collimated by the collimating lens 140, while maintaining the inherent polarization characteristics. The reference light is split into reflected reference light and transmitted reference light by the half mirror 144'. The reflected reference light (not shown) which could be harmful to the scanning operation by the principal light and hence is intercepted by a light interception member (not shown).

Part of the reference light incident upon the half mirror 144' is transmitted through the half mirror, so that the intensity thereof can be detected by a reference light detecting light receiver 512. Since the polarization of the reference light is constant, the variation of the polarization dependency of the half mirror 144', caused by a change in the humidity, can be detected by monitoring the light intensity detected by the reference light detecting light receiver 512. For instance, if the half mirror 144' has a transmittance (initial value) of 10% for the P-polarized light and 5% for the S-polarized light, respectively, the variation of the polarization dependency of the half mirror 144' with respect to the initial value (variation of the transmittance for the P-polarized light and S-polarized light) can be determined by monitoring the change in the output signal of the light receiver 512. The variation due to the humidity change is fed back to the circuit for producing the APC signal.

The control after the polarization dependency of the half mirror 144' is corrected in accordance with a change in the humidity is carried out in the same way as the measurement of the ambient humidity of the half mirror 144'. Namely, the value of the coefficient k in expression (1) is reset using the new transmittances Hp and Hs of the half mirror 144', so that the APC signal can be obtained. For example, if the transmittances of the half mirror for the S-polarized light and for the P-polarized light change from 5 & to 3% and from 10% to 12%, respectively, the change is detected by the reference light detecting light receiver 512. The new transmittances Hs and Hp thus detected are used in expression (2). The quantity rates Dp and Ds of the P-polarized light and the S-polarized light that reach the photosensitive drum 210 can be obtained based on the change in the transmittances Hs and Hp of the half mirror 144' and the quantity loss (set value) of the polarized light caused by the optical elements provided between the half mirror 144' and the photosensitive drum 210. Consequently, the APC signal corrected in accordance with the humidity change can be obtained. Moreover, as mentioned above, in the correction method in which the polarization dependency of the half mirror 144' is only taken into account, as represented by expression (3), the variation (transmittances Hp, Hs) of the polarization dependency of the half mirror 144' is obtained in the humidity dependency correction portion 510 and is fed back to produce the APC signal, so that the APC operation can be effectively carried out.

Figure 22:
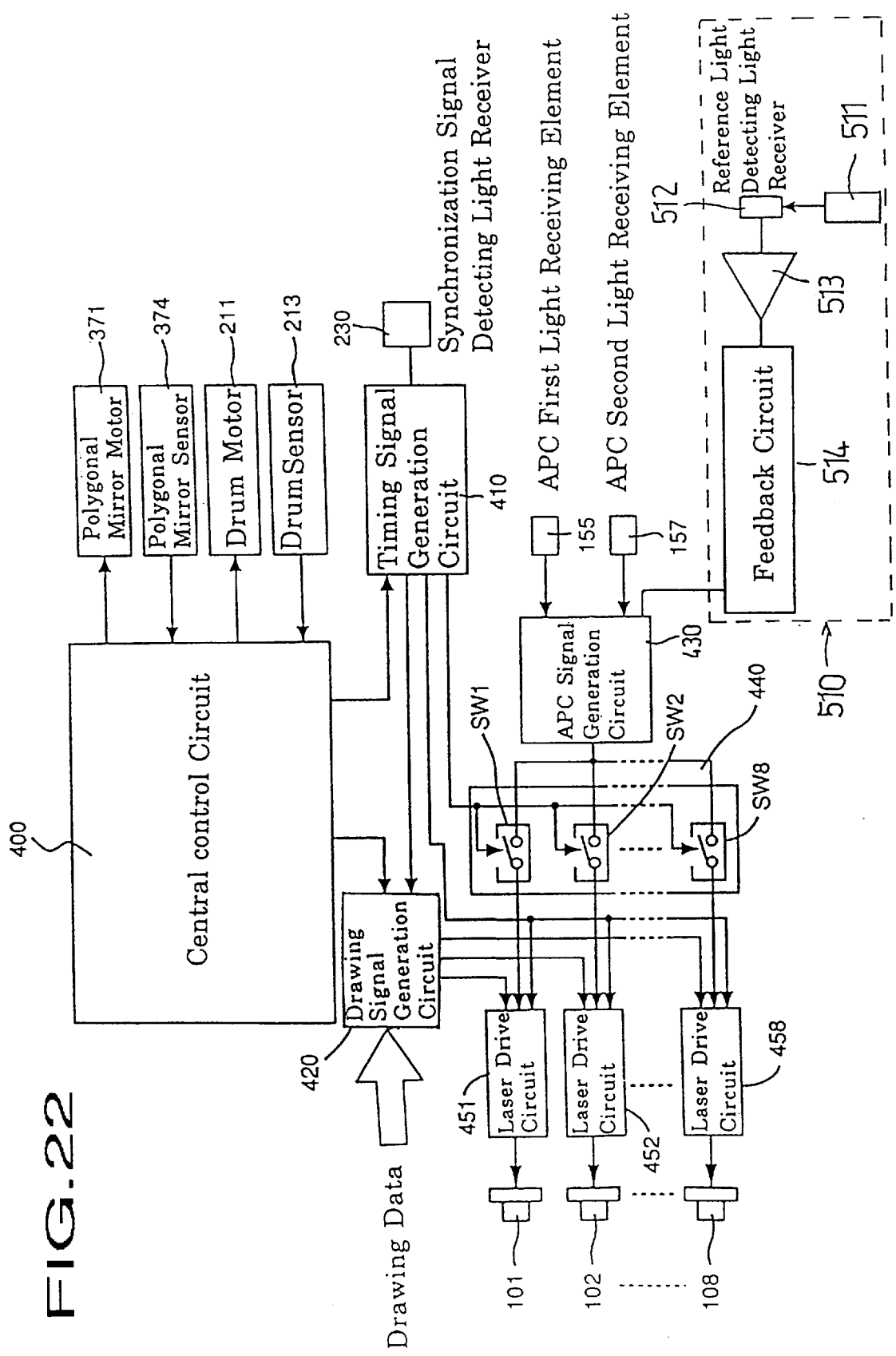
FIG. 22 is a block diagram of a control system in an optical scanner shown in FIG. 19.
Figure 23:
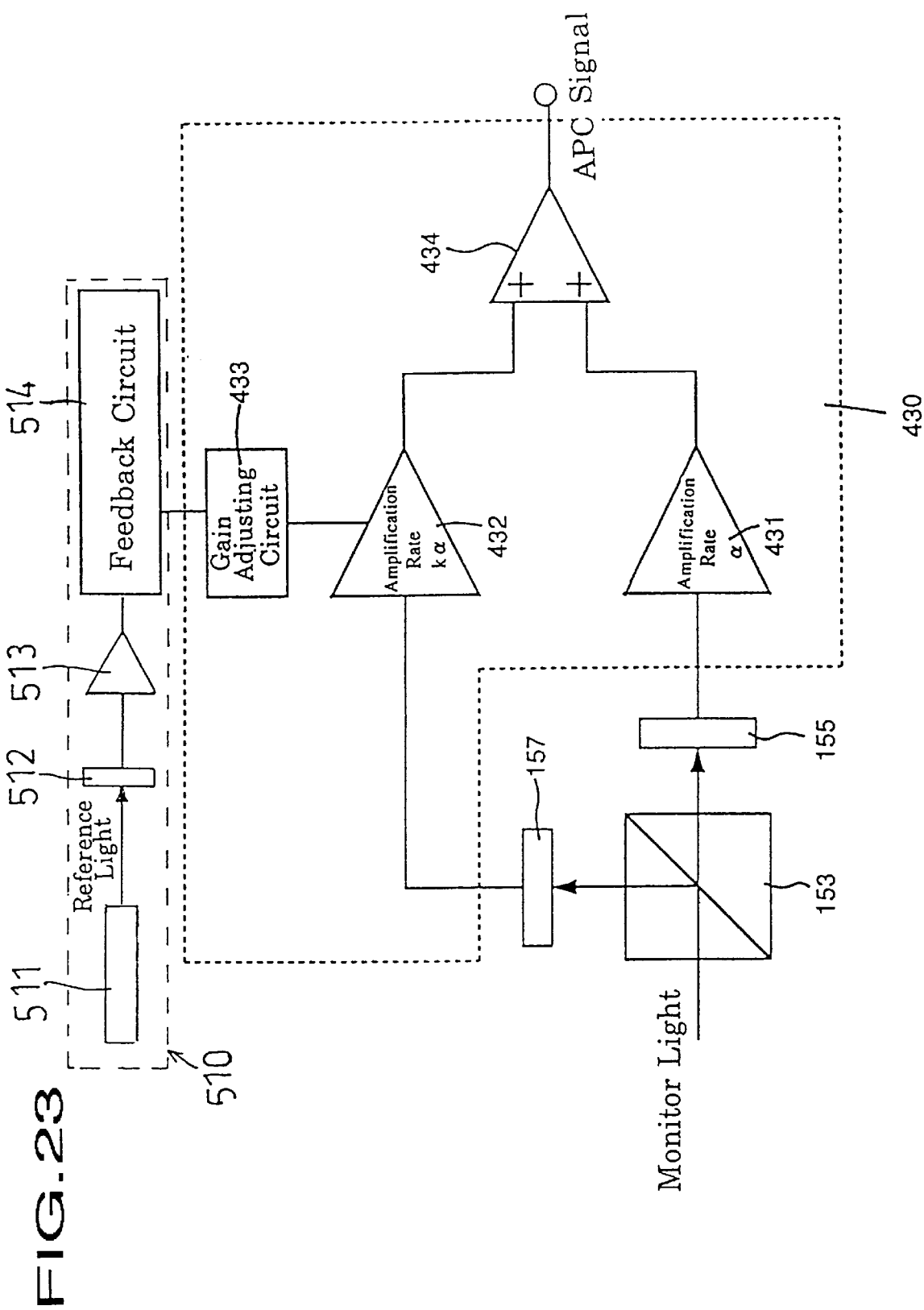
FIG. 23 is a block diagram of an APC signal generation circuit and an humidity dependency correction circuit, shown in FIG. 22.

FIGS. 22 and 23 show a circuit of an optical scanner having a humidity dependency correction portion 510. The humidity dependency correction portion 510 is composed of a reference light amplifier 513 which amplifies the output signal of the reference light detecting light receiver 512 which detects the light intensity of the transmitted reference light, and a feedback circuit 514 which specifies the variation in the polarization dependency of the half mirror 144' in accordance with the output of the reference light amplifier 513 and feeds the variation back to the gain adjusting circuit 433. The gain adjusting circuit 433 resets the weighing-value (coefficient k) of the output of the S-polarized light component, in accordance with the input variation in the polarization dependency.

Namely, the feedback circuit 514 outputs control signal for varying the coefficient k by the gain adjusting circuit 433, based on the directional change and the change of the amount of the receiving light with respect to the amount of receiving light on the light receiving device 512 when the humidity is that of the reference humidity. For example, if the beam splitter possesses characteristics such that the reflectance of the S-polarized increases as the humidity increases; if the humidity increases, the feedback circuit 113 outputs a control signal which indicates to what extent the gain adjusting circuit 433 has reduced the coefficient k. Based on this control signal, the gain adjusting circuit 433 resets the coefficient k to be smaller than the current value, so as to keep the APC signal at a certain level regardless of the increase of the humidity in the vicinity of the half mirror 144.

Conversely, if the humidity decreases, the feedback circuit 113 outputs control signal so that the gain adjusting circuit 433 resets the coefficient k at a larger value.

As mentioned above, since the humidity dependency correction portion 510 is associated with the APC signal generation circuit 430, the outputs of the light receiving elements 155 and 157 are adjusted so that the light intensity of the principal light on the photosensitive drum 210 and the intensity of the output signal of the monitor light detection means have a predetermined correlation if the polarization dependency of the half mirror 144' varies depending on the change in the humidity. Thus, the APC operation can be precisely carried out.

Although the APC first and second light receivers 155 and 157 which are used as a monitor of the intensity of the scanning light and the reference light receiver 512 which detects the intensity of the reference light are separately provided in FIGS. 19 through 23, it is possible to arrange the reference light source so that the reference light can be detected by the monitoring light receivers 155 and 157, as shown in FIG. 18 in which the emission timing of the light source 100 of the scanning optical system and the reference light source 511 is controlled. Consequently, the light receivers for the monitoring light and for the reference light can be commonly used.

Figure 24:
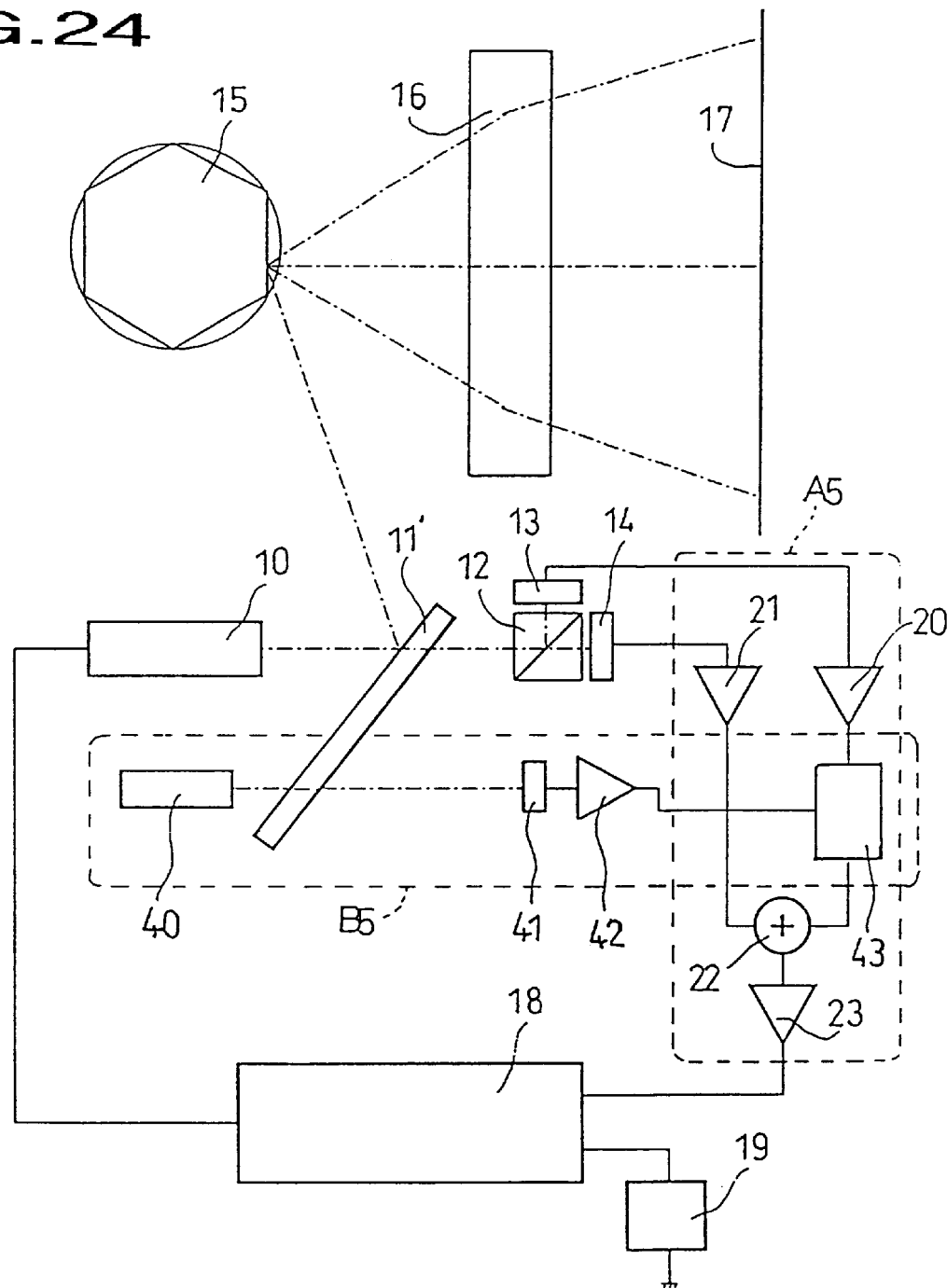
FIG. 24 is a schematic view of a light intensity control apparatus according to an embodiment of the present invention different from that shown in FIG. 17.

In the above-mentioned light intensity control apparatus using the reference light, the subject light whose output is to be adjusted upon correcting the weighing of the monitor light is not limited to the S-polarized light. For example, it is possible to vary the intensity of the output signal of the P-polarized light component of the monitor light, as shown in FIG. 24. In the humidity dependency correction circuit B5 shown in FIG. 24, the intensity of the reference light which is detected by the reference light detector 41 and is amplified by the amplifier 42 is fed back to the feedback circuit 43. The feedback circuit 43 is connected to the first amplifier 20 of the polarization dependency correction circuit A5 which amplifies the output of the optical detector 13 which detects the quantity of the P-polarized light. In this embodiment, the intensity of the output signal of the P-polarized light is controlled by the first amplifier 20 in accordance with the humidity change to adjust the weighing-value.

Figure 25:
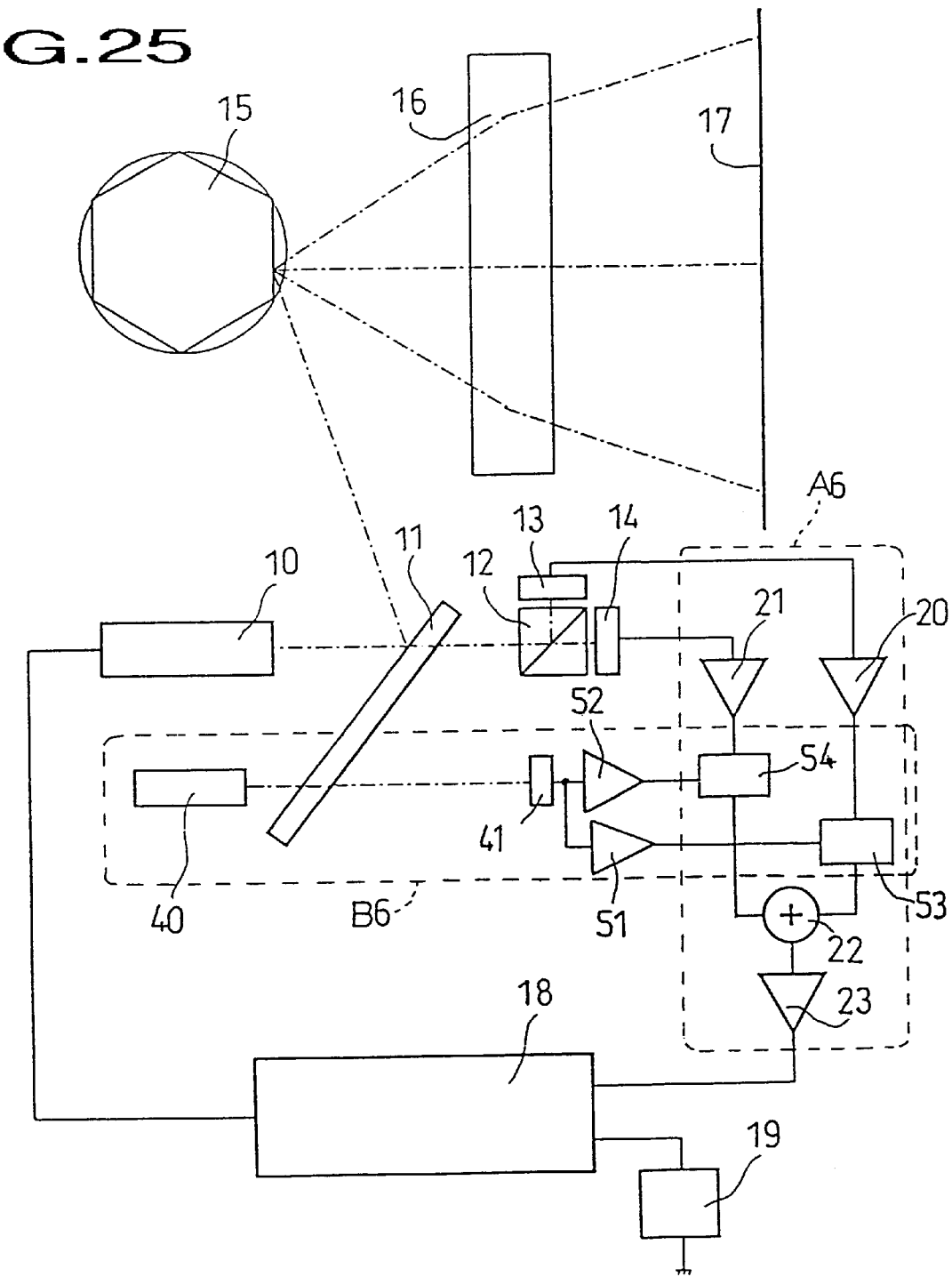
FIG. 25 is a schematic view of a light intensity control apparatus according to an embodiment of the present invention different from that shown in FIG. 17; and, FIG. 26 is a schematic view of a light intensity control apparatus according to an embodiment of the present invention different from that shown in FIG. 17.

FIG. 25 shows another embodiment in which the humidity dependency correction circuit B6 is provided with two amplifiers 51 and 52 which amplify the output of the reference light detection sensor 41. The output terminals of the amplifiers 51 and 52 are connected to the feedback circuits 53 and 54, respectively. The feedback circuit 53 is connected to the second amplifier 21 for the S-polarized light component in the polarization dependency correction circuit A6. The feedback circuit 54 is connected to the first amplifier 20 for the P-polarized light component. In this state, the intensities of the output signals of the P-polarized light component and the S-polarized light component of the monitor light are simultaneously adjusted and recombined depending on a change in the polarization dependency of the half mirror 11' which is detected by the reference light detection sensor 41 to thereby correct the humidity dependency of the half mirror 11'.

Figure 26:
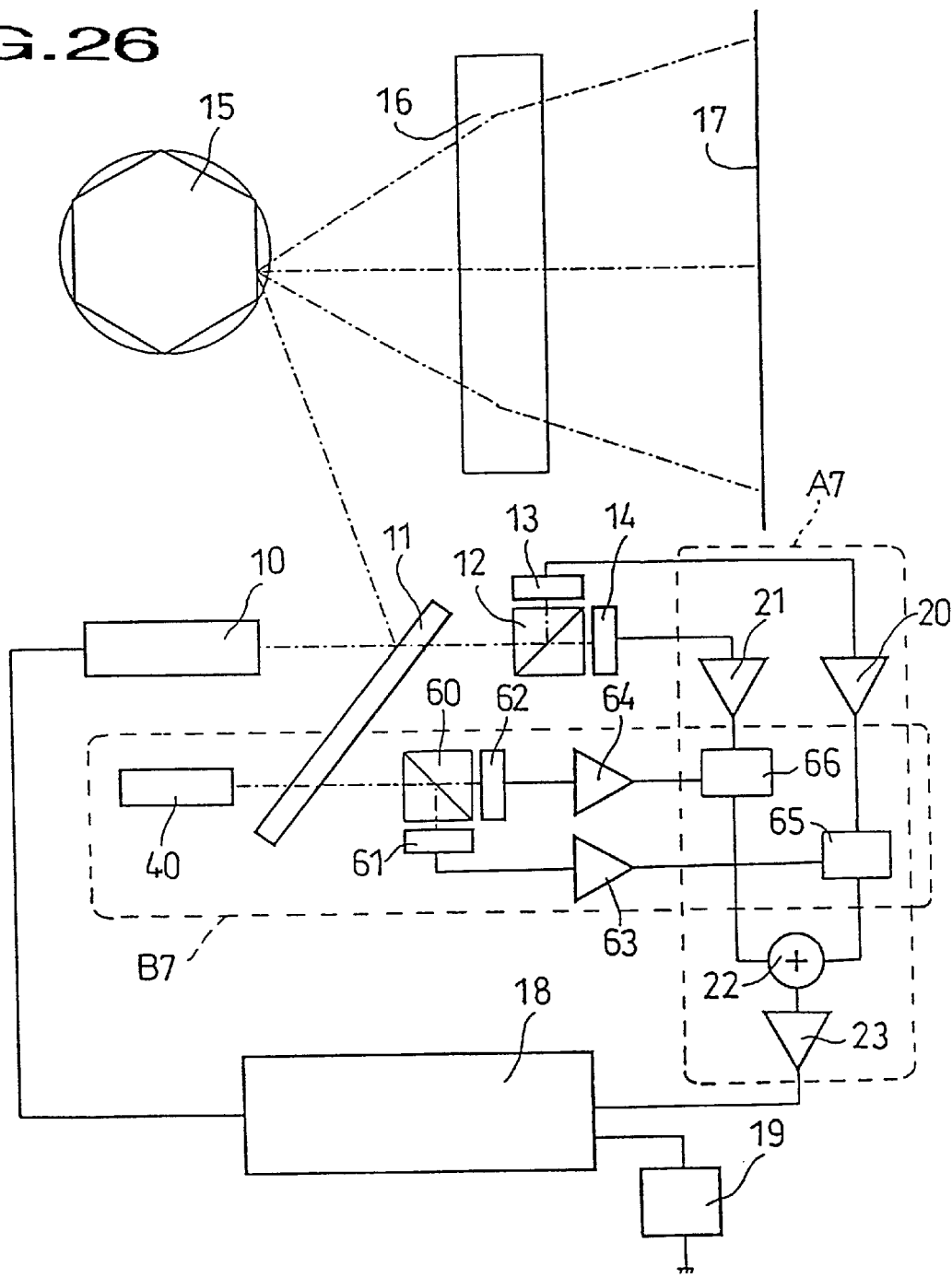

FIG. 26 shows yet another embodiment of the present invention, in which the humidity dependency correction circuit B7 is provided with a cubic polarization beam splitter 60 which splits the transmitted reference light into the P-polarized light component and S-polarized light component, in addition to the polarization beam splitter 12. The intensity of the P-polarized light split by the polarization beam splitter 60 is detected by a first sensor 61 for detecting the reference light and is amplified by an amplifier 63 and is fed back to a feedback circuit 65. Likewise, the intensity of the S-polarized light is detected by a second sensor 62 for detecting the reference light and is amplified by an amplifier 64 and is fed back to a feedback circuit 66. The feedback circuits 65 and 66 are respectively connected to the first and second amplifiers 20 and 21 of the polarization dependency correction circuit A7 to adjust the output signals of the P-polarized light component and the S-polarized light component to thereby correct humidity dependency.

Although the above discussion has been directed to the illustrated embodiments of the light intensity control apparatus and method, the present invention is not limited thereto and can be modified without departing from the spirit of the present invention in which a variation in the polarization dependency of the optical beam splitter, which varies due to a change in the humidity is detected and is fed back to the APC signal generation circuit to control the generation of the APC signal. The present invention can be particularly advantageously applied to an optical scanner but is not limited thereto. The present invention can be applied to any optical device which controls the intensity of the principal light, using the monitor light.

As can be understood from the above discussion, according to the present invention, since the APC signal is corrected taking into account the variation in the polarization dependency of the optical beam splitter (e.g. half mirror) which splits the incident light into monitor light and principal light, due to the change in the humidity, the quantity of the principal light can be precisely controlled regardless of a change in the ambient humidity of the beam splitter. Consequently, if the light intensity control apparatus or method of the present invention is applied, for example, to a multiple beam type optical scanner having a plurality of light sources, the intensity of the beam spots on the object surface to be scanned can be precisely controlled using the monitor light, regardless of a change in the polarization state of the light incident upon the beam splitter or the polarization dependency of the reflection-transmission characteristics of the beam splitter which varies depending on a change in the humidity.

What is claimed is:

1. A light intensity control apparatus comprising:

an optical beam splitter which splits light emitted from a light source device having at least one light source into monitor light and principal light;

a polarization beam splitter which splits said monitor light into first and second linearly polarized light components having orthogonal oscillation directions;

a monitor light detector for separately detecting the light intensities of said first and second linearly polarized light components of said monitor light;

an object surface on which said principal light being scanned;

a polarization correction device for correcting the output of said monitor light detector so that the intensity of the output signal of said monitor light detector and the light intensity of the principal light on said object surface have a predetermined correlation, regardless of the polarization state of the light incident upon said optical beam splitter;

a humidity dependency correction device which corrects the output of said monitor light detector via said polarization correction device by detecting a variation in polarization dependency characteristics of said optical beam splitter, caused by a change in humidity, and feeding the variation back to said polarization correction device, so that the output signal intensity of said monitor light detector and the light intensity of the principal light on said object surface have a predetermined correlation, regardless of a change in humidity; and a light emission controller for controlling the emission of the light of said light source device in accordance with the output signal of said monitor light detector which have been corrected by said polarization correction device and said humidity dependency correction device.

2. A light intensity control apparatus according to claim 1, wherein said humidity dependency correction device comprises:

a humidity detector for measuring the humidity in the vicinity of said optical beam splitter;

a polarization dependency variation detector for detecting the variation of the polarization dependency characteristics of said optical beam splitter based on the change in the output signal of said humidity detector; and a feedback device for feeding the detected variation of the polarization dependency characteristics of said optical beam splitter back to said polarization correction device.

3. A light intensity control apparatus according to claim 2, wherein said polarization correction device amplifies the output signal intensity of at least one of said first and second linearly polarized light components at a predetermined weighing-value and recombines the outputs of said first and second linearly polarized light components for correcting the output of said monitor light detector, and wherein if the humidity changes with respect to the reference humidity, said feedback device outputs a control signal based on the variation in humidity detected by said humidity detector, in accordance with said control signal, said polarization correction device corrects said weighing-value so as not to change the output signal intensity of said monitor light detector from before the change in humidity.

4. A light intensity control method in which light emitted from at least one light source is split into monitor light and principal light by an optical beam splitter; said monitor light is split into first and second linearly polarized light components having orthogonal oscillation directions by a polarization beam splitter; the light intensities of said first and second linearly polarized light components of said monitor light are separately detected by a monitor light detector; the output signal of said monitor light detector is corrected by a polarization correction device so that the output signal intensity of said monitor light detector and the light intensity of the principal light on an object surface have a predetermined correlation, regardless of the polarization state of the light incident upon said optical beam splitter; the emission of said light source is controlled based on the corrected output signal;

wherein said control method comprises in a setting stage:

setting the humidity when said optical beam splitter whose polarization dependency varies depending on the humidity has a predetermined polarization dependency at a reference humidity;

storing a variation rate of polarization dependency of said optical beam splitter when the humidity changes with respect to the reference humidity in a polarization dependency variation detector;

and wherein said control method comprises in a use stage:

measuring the humidity in the vicinity of said optical beam splitter by means of a humidity detector;

determining the variation of the polarization dependency characteristics of said optical beam splitter by means of said polarization dependency variation detector, in accordance with the difference between the measured humidity and the reference humidity;

feeding back the variation of the polarization dependency characteristics to said polarization correction device; and correcting the output of said monitor light detector in accordance with the input variation of the polarization dependency characteristics of said optical beam splitter so that the output signal intensity of said monitor light detector and the light intensity of the principal light on the object surface have a predetermined correlation, regardless of a change in humidity.

5. A light intensity control apparatus comprising:

an optical beam splitter which splits light emitted from a light source device having at least one light source into monitor light and principal light;

a polarization beam splitter which splits said monitor light into first and second linearly polarized light components having orthogonal oscillation directions;

a monitor light detector for separately detecting the light intensities of said first and second linearly polarized light components of said monitor light split by said polarization beam splitter;

an object surface on which said principal light being scanned;

a polarization correction device for correcting the output of said monitor light detector so that the intensity of the output signal of said monitor light detector and the light intensity of the principal light on said object surface have a predetermined correlation, regardless of the polarization state of the light incident upon said optical beam splitter;

a light emission controller for controlling the emission of the light of said light source device in accordance with the output signal of said monitor light detector which have been corrected by said polarization correction device;

a reference light supply device separate from said light source device, for making a reference light having constant polarization characteristics incident upon said optical beam splitter in the same direction and at the same incident angle as the light emitted from said light source device;

a reference light detector for detecting the light intensity of the reference light component of the reference light incident upon and split by said optical beam splitter that has the same direction as the monitor light;

a polarization dependency variation detector for detecting the variation of the polarization dependency characteristics of said optical beam splitter, based on a change in the output signal of said reference light detector when the polarization dependency characteristics of said optical beam splitter change due to a change in humidity; and a feedback device for feeding the detected variation of the polarization dependency of said optical beam splitter back to said polarization correction device;

wherein said polarization correction device corrects the output of said monitor light detector in accordance with the variation of the polarization dependency characteristics of said optical beam splitter input from said feedback device so that the output signal intensity of said monitor light detector and the light intensity of the principal light on said object surface have a predetermined correlation, regardless of a change in humidity.

6. A light intensity control apparatus according to claim 5, wherein said polarization correction device amplifies the output signal intensity of at least one of said first and second linearly polarized light components at a predetermined weighing-value and recombines the outputs of said first and second linearly polarized light components for correcting the output of said monitor light detector, and wherein when a change in humidity occurs, said feedback device outputs a control signal based on the change in output of said reference light detector, in accordance with said control signal, said polarization correction device corrects said weighing-value so as not to change the output signal intensity of said monitor light detector from before the change in humidity.

7. A light intensity control apparatus according to claim 5, wherein said monitor light detector and said reference light detector are made of separate light receiving elements.

8. A light intensity control apparatus according to claim 5, wherein said monitor light detector and said reference light detector are made of a common light receiving element.

9. A light intensity control method in which light emitted from at least one light source is split into monitor light and principal light by an optical beam splitter; said monitor light is split into first and second linearly polarized light components having orthogonal oscillation directions by a polarization beam splitter; the light intensities of said first and second linearly polarized light components of said monitor light are separately detected by a monitor light detector; the output signal of said monitor light detector is corrected by a polarization correction device so that the output signal intensity of said monitor light detector and the light intensity of the principal light on an object surface have a predetermined correlation, regardless of the polarization state of the light incident upon said optical beam splitter; the emission of said light source is controlled based on the corrected output signal;

wherein said control method comprises:

making reference light having constant polarization characteristics incident upon said optical beam splitter at the same incident angle and in the same direction as those of the light emitted from said light source and incident upon said optical beam splitter;

detecting the light intensity of the reference light component of the reference light incident upon and split by said optical beam splitter that has the same direction as said monitor light;

determining the variation of the polarization dependency characteristics of said optical beam splitter that varies depending on a change in humidity in accordance with the detected change in the output of the reference light transmitted through said optical beam splitter;

feeding back the variation of the polarization dependency characteristics to said polarization correction device; and correcting the output of said monitor light detector in accordance with the input variation of the polarization dependency characteristics of said optical beam splitter so that the output signal intensity of said monitor light detector and the light intensity of the principal light on the object surface have a predetermined correlation, regardless of the change in the humidity.

* * * * *